United States Patent
Chiu et al.

(10) Patent No.: US 8,736,069 B2
(45) Date of Patent: May 27, 2014

(54) MULTI-LEVEL VERTICAL PLUG FORMATION WITH STOP LAYERS OF INCREASING THICKNESSES

(75) Inventors: Chiajung Chiu, Zhubei (TW); Guanru Lee, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/593,328

(22) Filed: Aug. 23, 2012

(65) Prior Publication Data

US 2014/0054789 A1 Feb. 27, 2014

(51) Int. Cl.
*H01L 23/498* (2006.01)
*H01L 21/768* (2006.01)

(52) U.S. Cl.
USPC .......... 257/774; 257/E29.3; 257/E29.309; 257/E29.262; 257/773; 257/316; 257/314; 257/326; 257/325; 257/262

(58) Field of Classification Search
USPC .............. 257/316, 314, 326, 325, E29.3, 257/E29.309, E29.262, 773, 774
See application file for complete search history.

(56) References Cited

U.S. PATENT DOCUMENTS

| | | | |
|---|---|---|---|
| 6,034,882 A | 3/2000 | Johnson et al. |
| 6,323,117 B1 | 11/2001 | Noguchi |
| 6,906,361 B2 | 6/2005 | Zhang |
| 6,906,940 B1 | 6/2005 | Lue |
| 7,018,783 B2 | 3/2006 | Iwasaki et al. |
| 7,081,377 B2 | 7/2006 | Cleeves |
| 7,129,538 B2 | 10/2006 | Lee et al. |
| 7,177,169 B2 | 2/2007 | Scheuerlein |
| 7,274,594 B2 | 9/2007 | Pascucci et al. |
| 7,315,474 B2 | 1/2008 | Lue |
| 7,382,647 B1 | 6/2008 | Gopalakrishnan |
| 7,420,242 B2 | 9/2008 | Lung |

(Continued)

FOREIGN PATENT DOCUMENTS

| | | |
|---|---|---|
| EP | 1936681 A1 | 6/2008 |
| EP | 2048709 A2 | 4/2009 |
| TW | I308374 B | 4/2009 |
| TW | 201123266 A | 7/2011 |

OTHER PUBLICATIONS

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

(Continued)

*Primary Examiner* — Alexander Oscar Williams
(74) *Attorney, Agent, or Firm* — Yiding Wu; Haynes Beffel & Wolfeld LLP

(57) ABSTRACT

A method is provided for use with an IC device including a stack including a plurality of conductive layers interleaved with a plurality of dielectric layers, for forming interlayer connectors extending from a connector surface to respective conductive layers. The method forms landing areas on the plurality of conductive layers in the stack. The landing areas are without overlying conductive layers in the stack. The method forms etch stop layers over corresponding landing areas. The etch stop layers have thicknesses that correlate with depths of the corresponding landing areas. The method fills over the landing areas and the etch stop layers with a dielectric fill material. Using a patterned etching process, the method forms a plurality of vias extending through the dielectric fill material and the etch stop layers to the landing areas in the plurality of conductive layers.

9 Claims, 32 Drawing Sheets

(56) References Cited

U.S. PATENT DOCUMENTS

| | | | |
|---|---|---|---|
| 7,851,849 | B2 | 12/2010 | Kiyotoshi |
| 2004/0023499 | A1 | 2/2004 | Hellig et al. |
| 2005/0280061 | A1 | 12/2005 | Lee |
| 2007/0140001 | A1 | 6/2007 | Motoi et al. |
| 2007/0231750 | A1* | 10/2007 | Parikh ............................ 430/316 |
| 2008/0073635 | A1 | 3/2008 | Kiyotoshi et al. |
| 2008/0096327 | A1 | 4/2008 | Lee et al. |
| 2008/0101109 | A1 | 5/2008 | Haring-Bolivar et al. |
| 2008/0175032 | A1 | 7/2008 | Tanaka et al. |
| 2008/0180994 | A1 | 7/2008 | Katsumata et al. |
| 2008/0247230 | A1 | 10/2008 | Lee et al. |
| 2008/0285350 | A1 | 11/2008 | Yeh |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2011/0031630 | A1 | 2/2011 | Hashimoto |
| 2012/0119283 | A1* | 5/2012 | Lee et al. ....................... 257/316 |
| 2013/0082341 | A1* | 4/2013 | Shimizu et al. ................ 257/431 |
| 2013/0341797 | A1* | 12/2013 | Lim ............................... 257/773 |

OTHER PUBLICATIONS

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Paul et al., "Impact of a Process Variation on Nanowire and Nanotube Device Performance," IEEE Trans. on Electron Devices, vol. 54, No. 9, Sep. 2007, pp. 2369-2376.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Fukuzumi et al. "Optimal Integration and Characteristics of Vertical Array Devices for Ultra-High Density, Bit-Cost Scalable Flash Memory," IEEE Dec. 2007, pp. 449-452.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

* cited by examiner

MULTI-LEVEL VERTICAL PLUG FORMATION WITH STOP LAYERS OF INCREASING THICKNESSES

BACKGROUND OF THE INVENTION

1. Field of the Invention

The present invention relates to high density integrated circuit devices, and more particularly to interconnect structures for multi-level three-dimensional stacked devices.

2. Description of Related Art

In three-dimensional (3D) stacked memory devices, multi-level vertical plugs are used to couple multiple layers of memory cells to decoding circuitry. Z-direction decoding ("Z-decoding") in 3D memory devices can be challenging. Methods such as minimal incremental layer cost (MiLC) are complicated and expensive. Methods such as direct vertical plug landing on multi-layers are straightforward for Z-decoding. However, they decrease the process window as the number of layers increase, because the depth difference between top and bottom layers may be larger than several hundreds to several thousands of nanometers.

It is desirable to provide a method for Z-decoding in 3D memory manufacturing that enlarges the process window as compared to existing technologies.

SUMMARY OF THE INVENTION

The present invention provides a method for use with an integrated circuit device including a stack including a plurality of conductive layers interleaved with a plurality of dielectric layers. The method is for forming interlayer connectors extending from a connector surface to respective ones of the plurality of conductive layers. The method includes forming landing areas on the plurality of conductive layers in the stack, where the landing areas are without overlying conductive layers in the stack. The method forms etch stop layers over corresponding landing areas. The etch stop layers have thicknesses that correlate with depths of the corresponding landing areas. The method fills over the landing areas and the etch stop layers with a dielectric fill material. Using a patterned etching process, the method forms a plurality of vias extending through the dielectric fill material and the etch stop layers to the landing areas in the plurality of conductive layers.

Other aspects and advantages of the present invention can be seen on review of the drawings, the detailed description and the claims, which follow.

DETAILED DESCRIPTION

A detailed description of embodiments of the present invention is provided with reference to the FIGS. 1-32.

Figure 1:
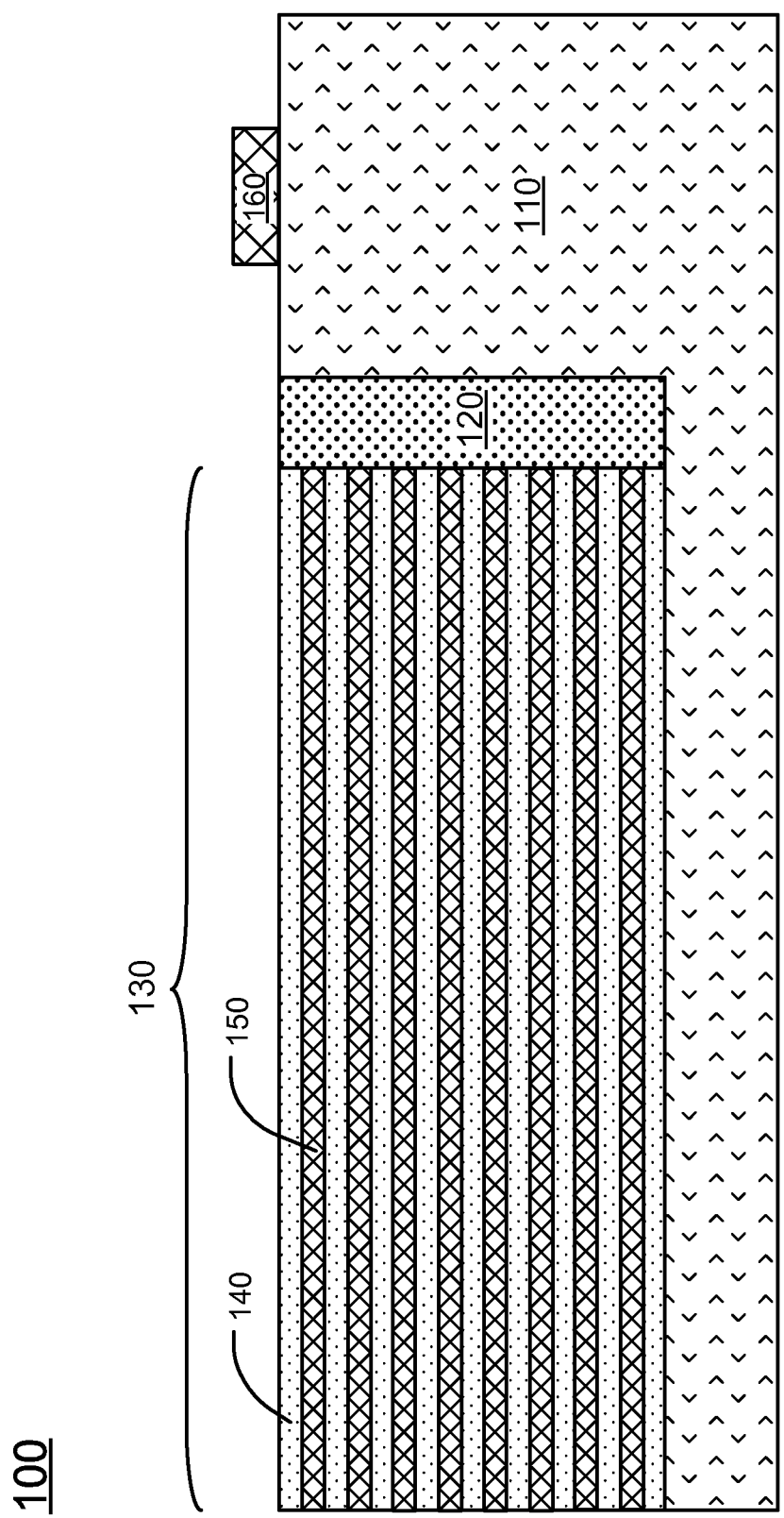
FIG. 1 is a simplified cross-sectional view of one example of an integrated circuit device including a stack on a silicon substrate.

FIG. 1 is a simplified cross-sectional view of one example of an integrated circuit device 100 including a stack 130 on a silicon substrate 110. The stack 130 includes a plurality of conductive layers 150 interleaved with a plurality of dielectric layers 140. An isolation region 120 separates the stack 130 from an array periphery region including a periphery polysilicon gate 160.

In this example, there are eight pairs of dielectric layers 140 and conductive layers 150 in the stack 130. Dielectric layers 140 can be an oxide, nitride, oxynitride, silicate, or others. Low dielectric constant (low-k) materials having a dielectric constant smaller than that of silicon dioxide, such as $SiCHO_x$, may be preferred. High dielectric constant (high-k) materials having a dielectric constant greater than that of silicon dioxide, such as $HfO_x$, HfON, $AlO_x$, $RuO_x$, $TiO_x$, may be included also.

Conductive layers 150 can be electrically conductive semiconductors including heavily doped polysilicon (using dopants such as As, P, B), silicides including TiSi, CoSi, oxide semiconductors, including InZnO, InGaZnO, and combinations of semiconductors and silicides. Conductive layers 150 can also be a metal, a conductive compound, or combinations of materials including Al, Cu, W, Ti, Co, Ni, TiN, TaN, TaAlN, and others.

Three flows are described below for forming interlayer connectors (vertical plugs) extending from a connector surface to respective ones of the plurality of conductive layers. Etch stop layers of increasing thicknesses are used in the flows, and typically include etch stop material such as silicon nitride (SiN), which can resist etching of vertical plugs. The method provides thicker etch stop layers for shorter interlayer connectors, and thinner etch stop layers for longer interlayer connectors. Each flow is based on the integrated circuit device 100 shown in FIG. 1. The integrated circuit device 100 is illustrated as an example of one type of integrated circuit device with which the present invention can be used; others are also possible.

Figure 2:
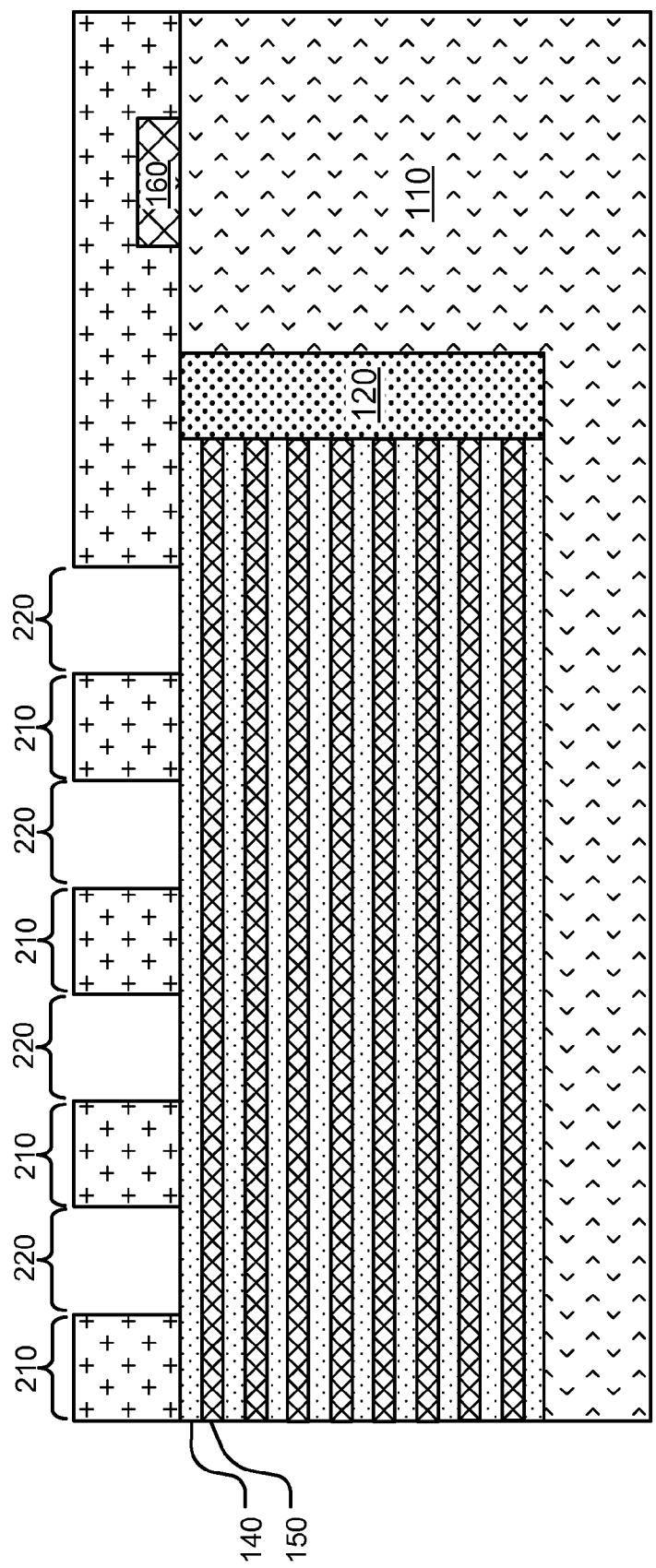
FIGS. 2-12 illustrate a method of forming interlayer connectors with triple etch stop layers for a first flow.

FIGS. 2-12 illustrate a method of forming interlayer connectors with triple etch stop layers for a first flow. The triple etch stop layers include etch stop layers of three thicknesses. The first thickness of the three thicknesses results from an incremental deposition of etch stop material. The second thickness results from two incremental depositions of etch stop material, and thus is approximately equal to twice the first thickness. The third thickness results from three incremental depositions of etch stop material, and thus is approximately equal to three times the first thickness. Thus, one etch layer may be combined from one, two or three incremental depositions of etch stop material. FIG. 2 illustrates a first etch mask formed over the integrated circuit device 100 shown in FIG. 1. The first etch mask includes a first set of mask regions 210, and a first set of spaced apart open etch regions 220 corresponding to selected landing areas on alternating dielectric layers 140 and conductive layers 150. The selected landing areas will become evident from the discussion below.

Figure 3:
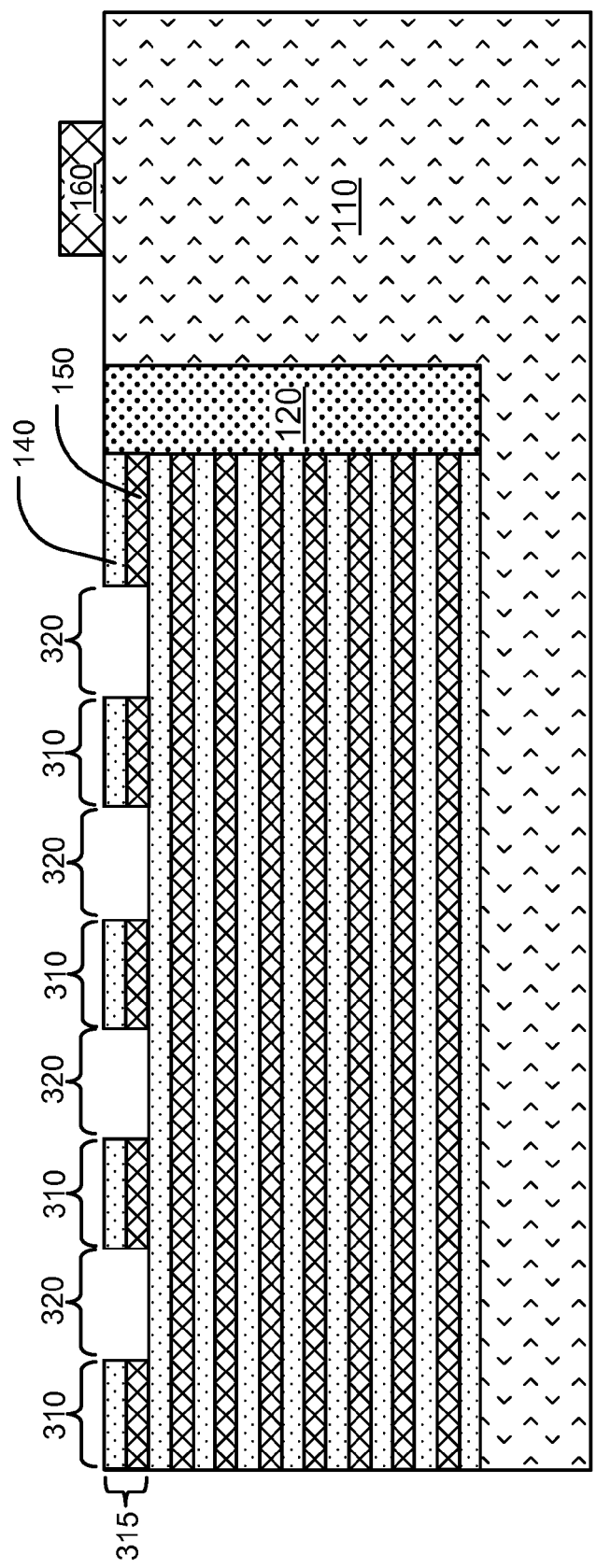

FIG. 3 illustrates the result of etching using the first etch mask on the alternating dielectric layers 140 and conductive layers 150. In reference to FIG. 3, the method removes portions of the alternating dielectric layers 140 and conductive layers 150 for forming landing areas 310 and 320 on the plurality of conductive layers 150 (FIG. 2). The landing areas 310 and 320 are without overlying conductive layers in the stack 130. A first pair 315 of dielectric layers 140 and conductive layers 150 on top of the stack 130 (FIG. 1) are etched through to form landing areas 310 and 320, under the first set of open etch regions 220 (FIG. 2). The first etch mask is removed across the integrated circuit device 100 after the landing areas 310 and 320 are formed.

Figure 4:
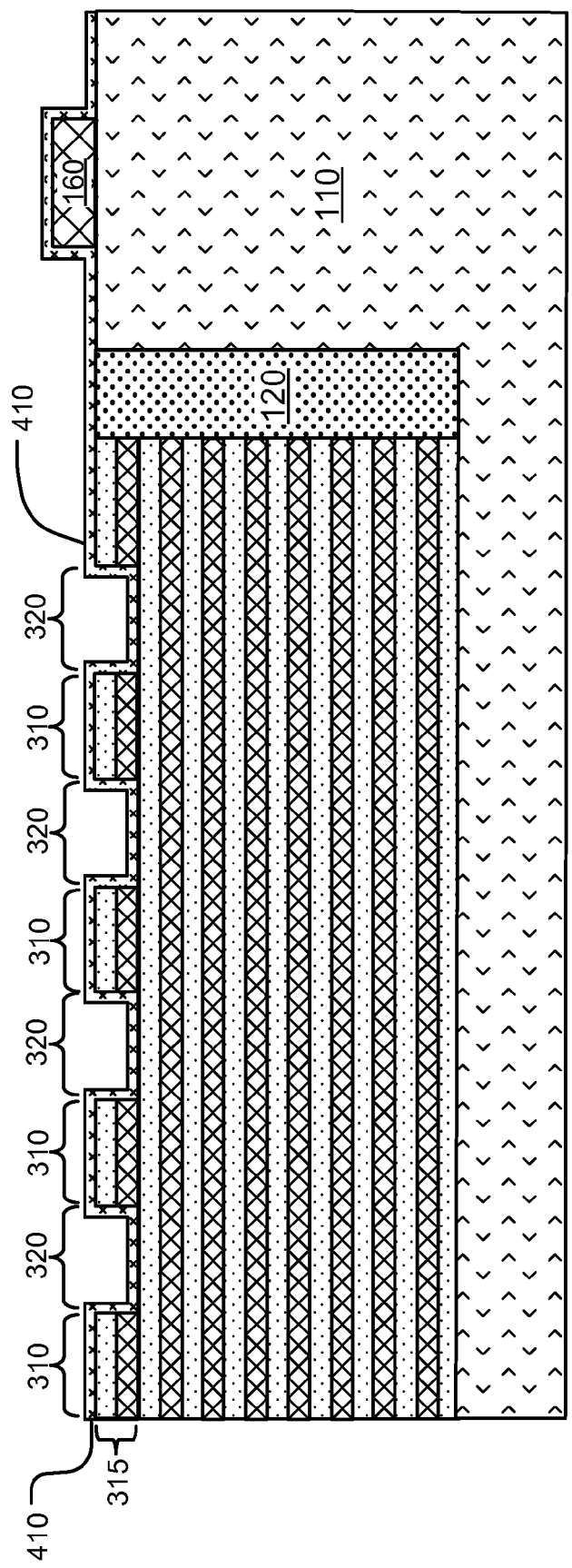

In reference to FIG. 4, the method forms a first incremental deposition of etch stop material 410 over the landing areas 310 and 320. The method may form more incremental depositions of etch stop material as described later. The etch stop layers have thicknesses that correlate with depths of the corresponding landing areas.

Materials used for etch stop layers are characterized by having an etch rate in a chosen etch process that is less than the etch rate of the dielectric fill material, and for which at least some of the etch stop layer remains in the openings over the shallower landing areas when the etch stop layer for the deepest landing area is reached. Silicon nitride for example, is used commonly as an etch stop material for forming vias through silicon oxide materials, using an etch process such as dry etching. A break through etch can be used to remove the etch stop layers in the bottoms of the vias, to complete the via to the landing layer.

Figure 5:
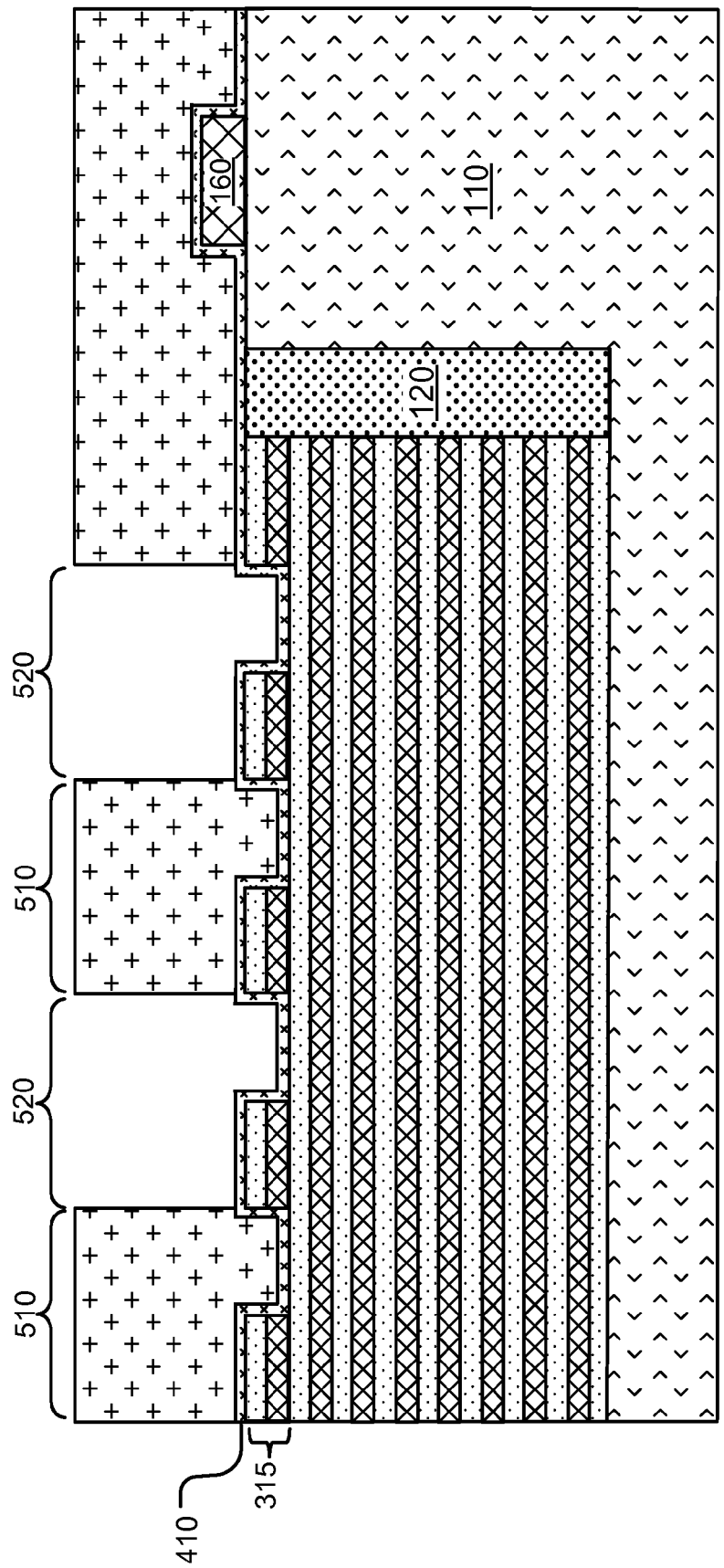

FIG. 5 illustrates a second etch mask formed over the first incremental deposition of etch stop material 410. The second etch mask includes a second set of mask regions 510, and a second set of spaced apart open etch regions 520 for landing areas on alternating dielectric layers 140 and conductive layers 150.

Figure 6:
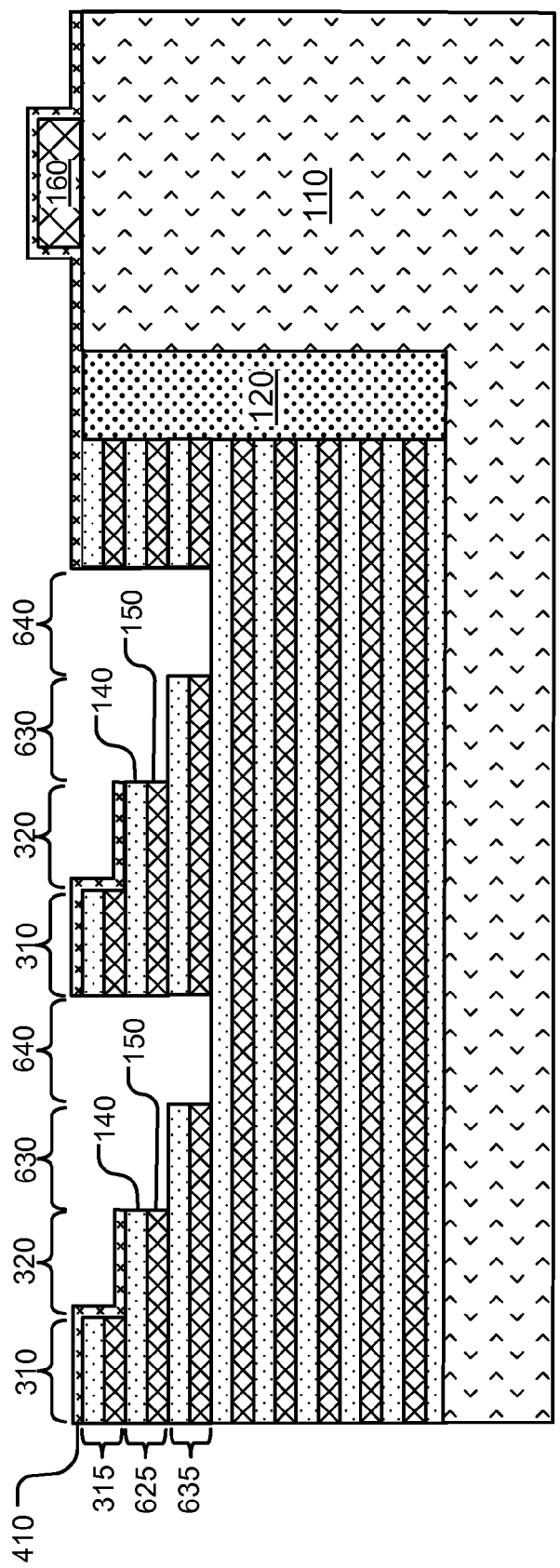

FIG. 6 illustrates the result of etching using the second etch mask on the alternating dielectric layers 140 and conductive layers 150. In reference to FIG. 6, the method removes portions of the first incremental deposition of etch stop material 410, and portions of the alternating dielectric layers 140 and conductive layers 150 to form landing areas 630 and 640 on the plurality of conductive layers 150. The landing areas 630 and 640 are without overlying conductive layers in the stack 130. A second pair 625 and a third pair 635 of dielectric layers 140 and conductive layers 150 in the stack 130 are etched through to form landing areas 630 and 640, respectively, under the second set of open etch regions 520. The second etch mask is removed after the landing areas 630 and 640 are formed.

Figure 7:
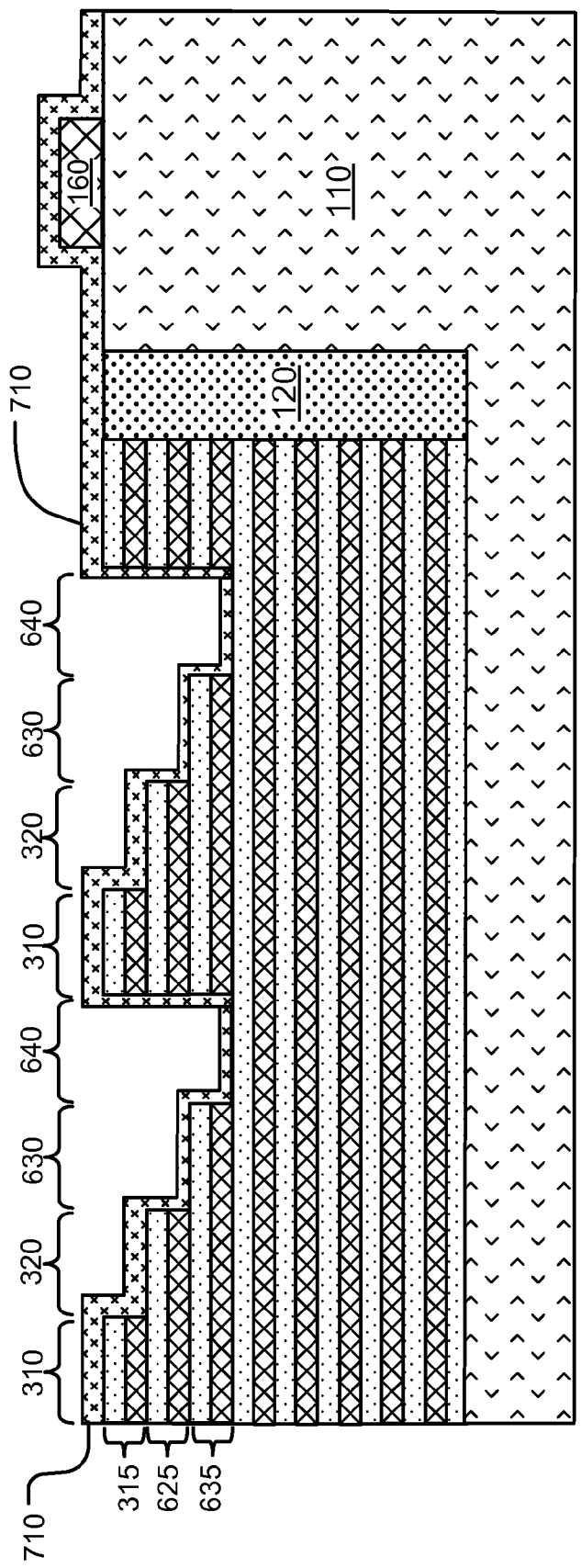

In reference to FIG. 7, the method forms a second incremental deposition of etch stop material 710 over the landing areas 310, 320, 630 and 640. Since the first incremental deposition of etch stop material 410 is already formed over the landing areas 310 and 320, consequently two incremental depositions of etch stop material are formed over the landing areas 310 and 320, and one incremental deposition of etch stop material is formed over the landing areas 630 and 640.

Figure 8:
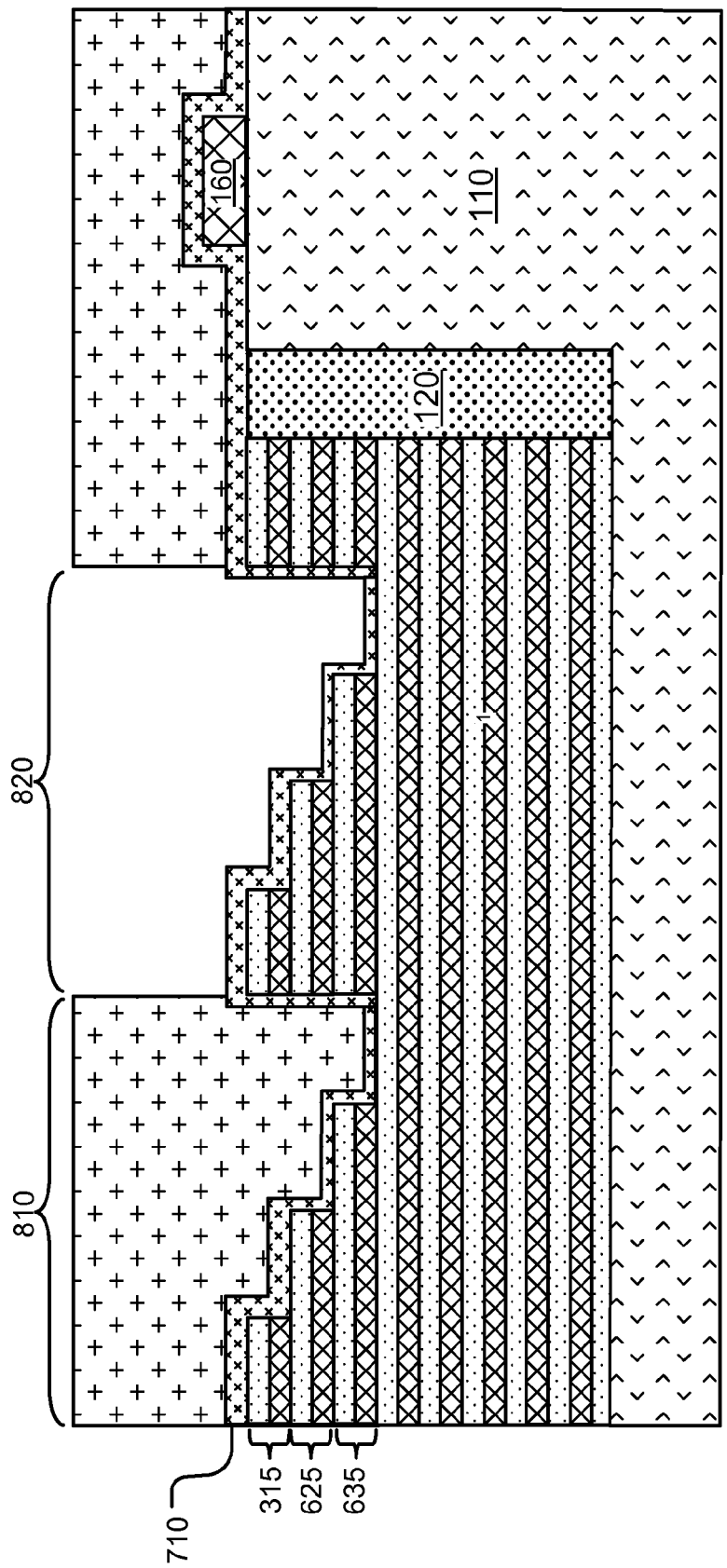

FIG. 8 illustrates a third etch mask formed over the second incremental deposition of etch stop material 710. The third etch mask includes a third set of mask regions 810, and a third set of spaced apart open etch regions 820 for landing areas on alternating dielectric layers 140 and conductive layers 150.

Figure 9:
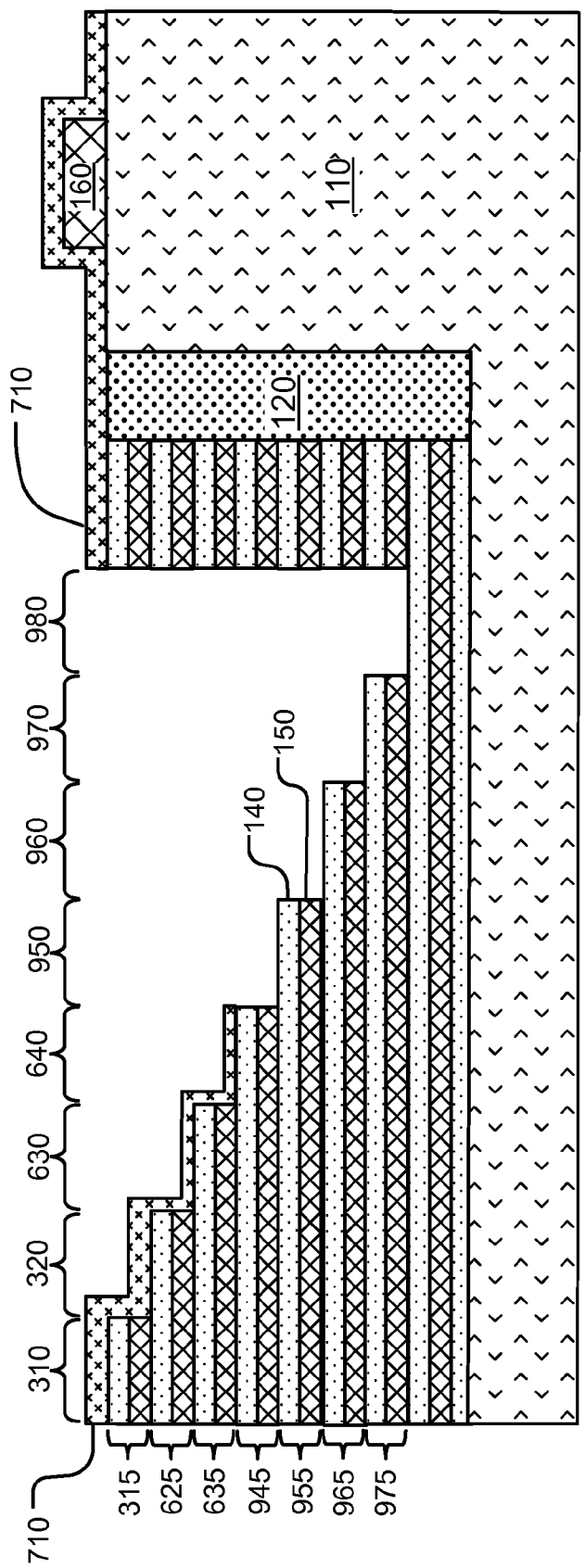

FIG. 9 illustrates the result of etching using the third etch mask on the alternating dielectric layers 140 and conductive layers 150. In reference to FIG. 9, the method removes portions of the first incremental deposition of etch stop material 410, portions of the second incremental deposition of etch stop material 710, and portions of the alternating dielectric layers 140 and conductive layers 150 to form landing areas 950, 960, 970, and 980 on the plurality of conductive layers 150. The landing areas 950, 960, 970, and 980 are without overlying conductive layers in the stack 130. A fourth pair 945, a fifth pair 955, a sixth pair 965, and a seventh pair 975 of dielectric layers 140 and conductive layers 150 in the stack 130 are etched through to form landing areas 950, 960, 970, and 980, respectively, under the third set of open etch regions 820. The third etch mask is removed after the landing areas 950, 960, 970, and 980 are formed.

Figure 10:
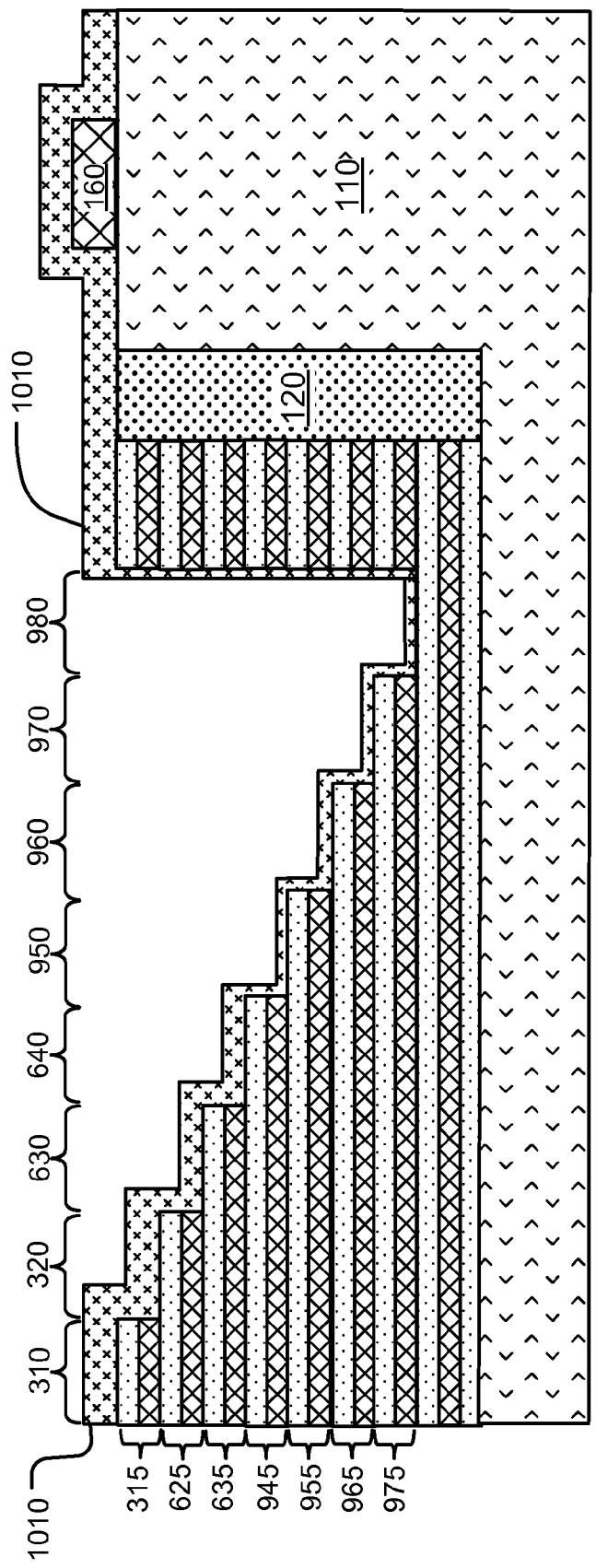

In reference to FIG. 10, the method forms a third incremental deposition of etch stop material 1010 over the landing areas 310, 320, 630, 640, and 950-980. Since the first incremental deposition of etch stop material 410 is already formed over the landing areas 310-320, and the second incremental deposition of etch stop material 710 is already formed over the landing areas 310-320 and 630-640, consequently three incremental depositions of etch stop material are formed over the landing areas 310-320, two incremental depositions of etch stop material are formed over the landing areas 630-640, and one incremental deposition of etch stop material is formed over the landing areas 950-980.

Figure 11:
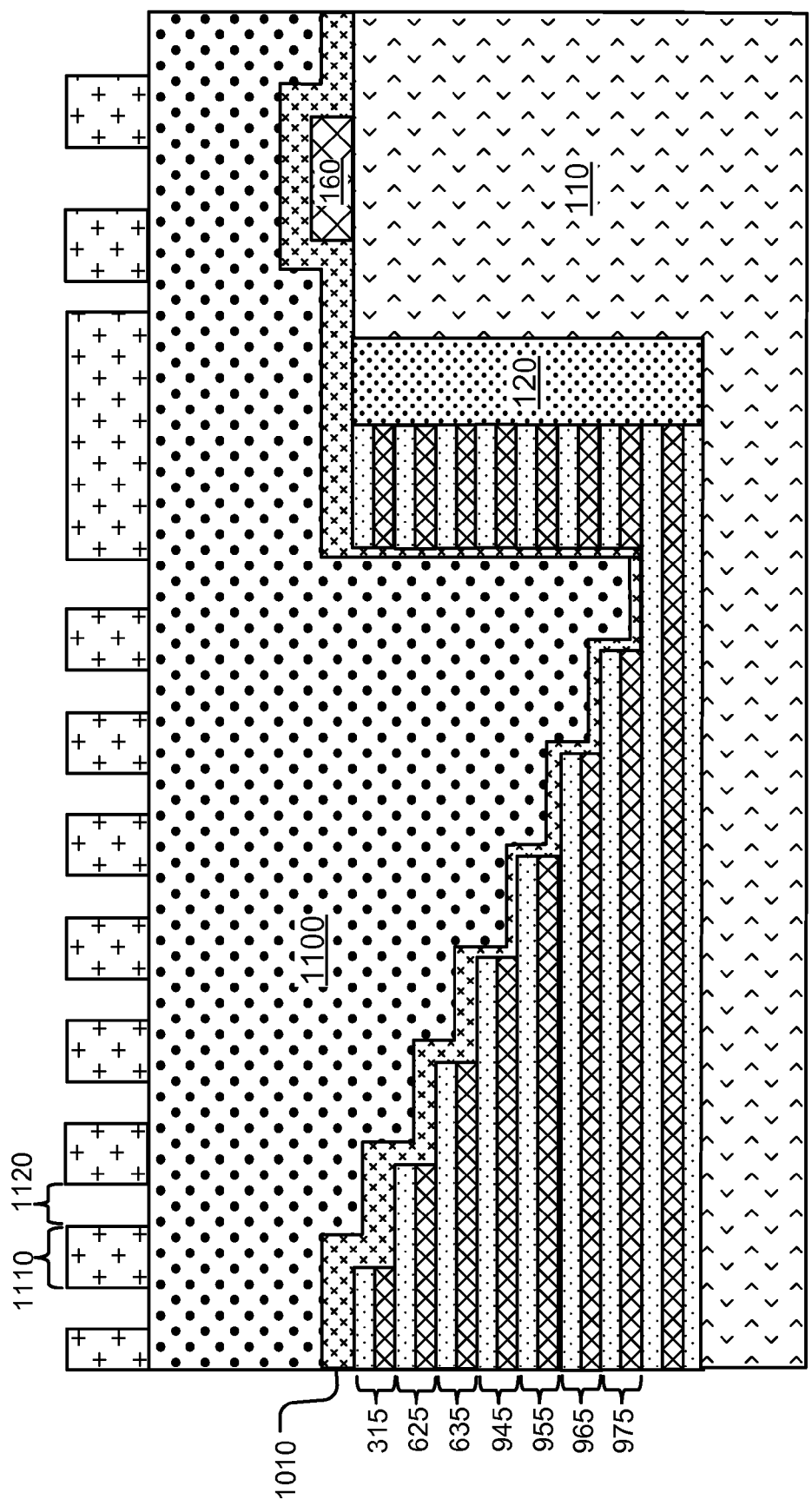

In reference to FIG. 11, the method fills over the landing areas 310, 320, 630, 640, and 950-980 with a dielectric fill material 1100, and forms a contact opening (CO) etch mask over the dielectric fill material 1100. The CO mask includes a set of mask regions 1110, and a set of spaced apart open etch regions 1120 for landing areas on alternating dielectric layers 140 and conductive layers 150.

Figure 12:
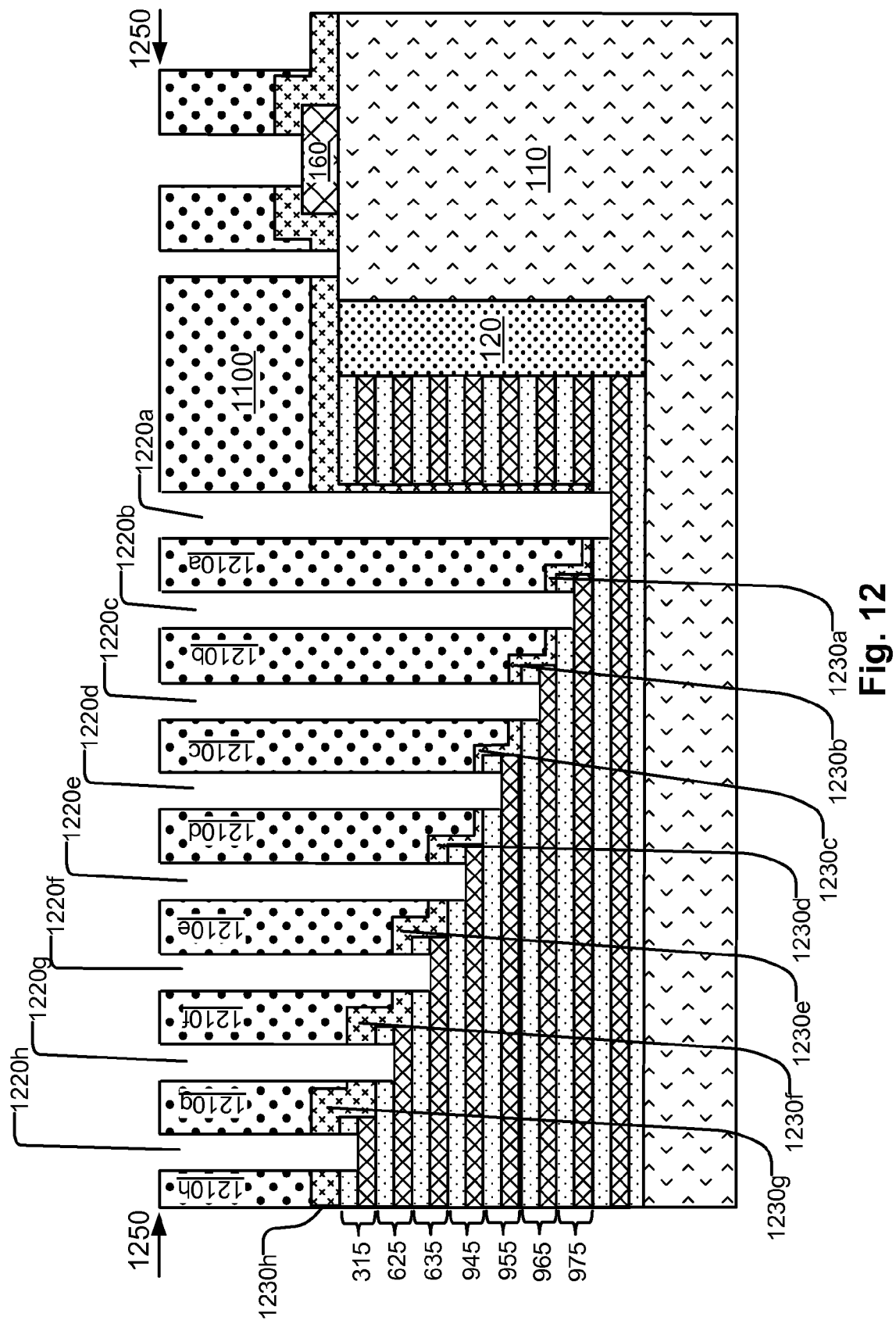

In reference to FIG. 12, the method uses a patterned etching process using the CO etch mask to form a plurality of vias 1220a-1220h extending through the dielectric fill material 1100 and the etch stop layers to the landing areas 310-320, 630-640, and 950-980 (FIGS. 3, 6, and 9) in the plurality of conductive layers 150. The patterned etching process includes first opening down to the etch stop layers, and second breaking through the etch stop layers to expose the landing areas.

Subsequently, the method forms interlayer connectors by filling the vias 1220a-1220h with conductive material up to the connector surface 1250. A planarization process may be applied to the plurality of filled vias to planarize the connector surface 1250. Thus the interlayer connectors are formed extending from the connector surface 1250 to respective ones of the plurality of conductive layers. The method may then form patterned conductor lines (not shown) on top of the connector surface and connected to respective interlayer connectors. The patterned conductor lines may be bit lines that connect to a plane decoder in three-dimensional stacked memory devices.

As described herein, to remove portions of the alternating dielectric and conductive layers to form landing areas on the plurality of conductive layers in the stack 130, the method uses a set of N etch masks with $2^{N-2}$ being less than W, and $2^N$ being greater than or equal to W, where the W is the number of conductive layers. For instance, see FIGS. 1-12, where N=3 and W=8. Thus, the method uses a set of three etch masks with $2^N=8$ being equal to the W. The etch masks have mask regions and spaced apart open etch regions corresponding to selected landing areas, as shown in FIGS. 2, 5, and 8.

As described herein, for each etch mask n, where n goes from 1 to N, the method etches $2^{n-1}$ conductive layers over up to half of the landing areas, so that the landing areas on the plurality of conductive layers are exposed with different combinations of the etch masks. For instance, for etch mask n=1, the method etches 1 ($2^{1-1}=2^0=1$) conductive layer as shown in FIG. 3. For etch mask n=2, the method etches 2 ($2^{2-1}=2^1=2$) conductive layers as shown in FIG. 6. For etch mask n=3, the method etches 4 ($2^{3-1}=2^2=4$) conductive layers as shown in FIG. 9. In each case, the method etches up to 4 or half of the 8 landing areas.

As described herein, after etching using each of the N etch masks, the method forms a layer of etch stop material over the landing areas before etching using another of the etch masks. For instance, after etching using the first etch mask including mask regions 210 and open etch regions 220 as shown in FIG. 2, the method forms a layer of etch stop material 410 over the landing areas before etching using another of the etch masks, such as the second etch mask including mask regions 510 and open etch regions 520 as shown in FIG. 5. For another instance, after etching using the second etch mask including mask regions 510 and open etch regions 520 as shown in FIG. 5, the method forms a second incremental deposition of etch stop material 710 over the landing areas before etching using another of the etch masks, such as the third etch mask including mask regions 810 and open etch regions 820 as shown in FIG. 8.

For a second flow, FIGS. 13-20 illustrate a method of forming interlayer connectors with double etch stop layers. The double etch stop layers include etch stop layers of two thicknesses. The first thickness of the two thicknesses results from an incremental deposition of etch stop material. The second thickness results from two incremental depositions of etch stop material, and thus is approximately equal to twice the first thickness. Thus one etch layer may be combined from one, or two incremental depositions of etch stop material. The interlayer connectors in the second flow extend from a connector surface to respective ones of the plurality of conductive layers. The second flow is based on the partially formed integrated circuit device 100 shown in FIGS. 1-3. FIGS. 13-20 illustrate the second flow, continuing from FIG. 3.

Figure 13:
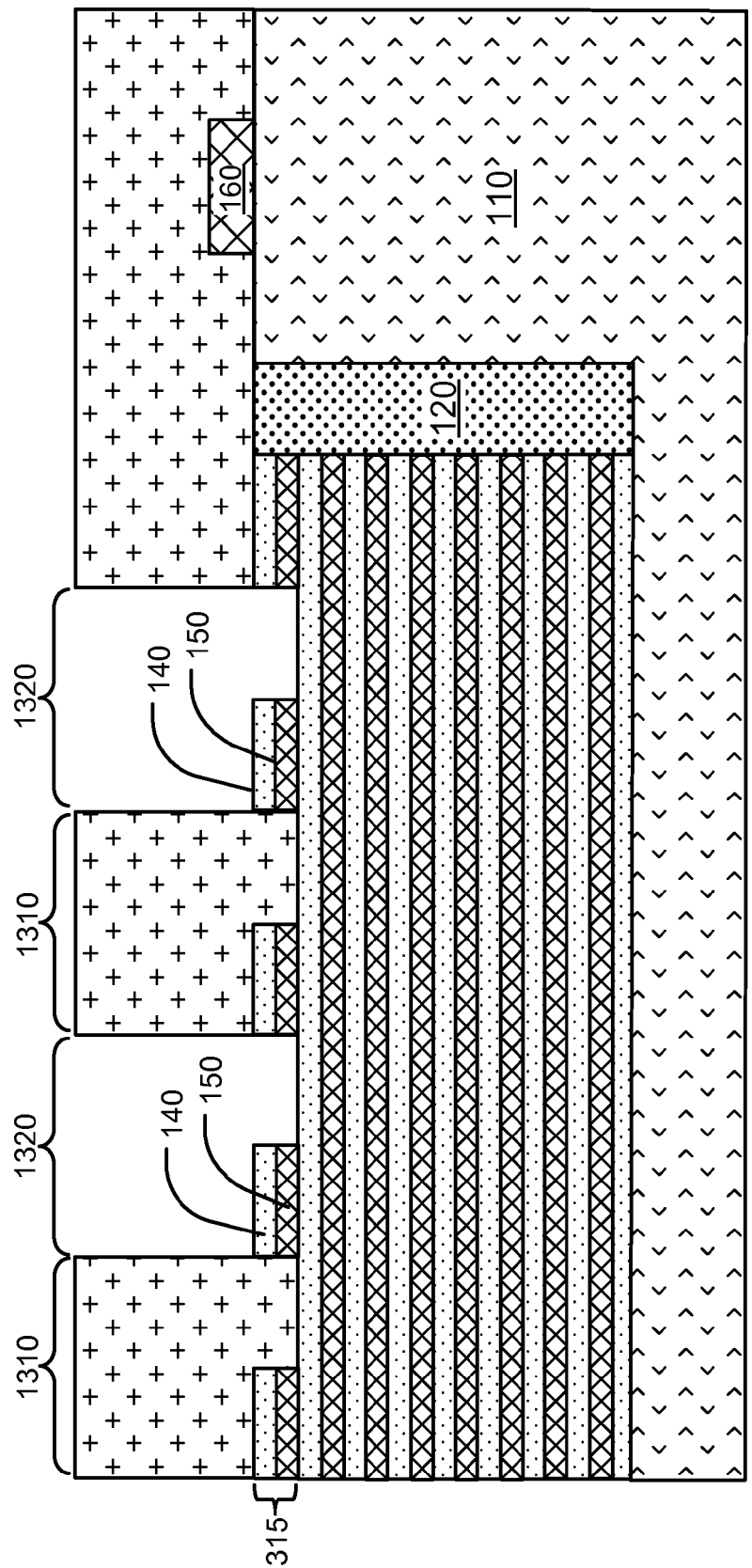
FIGS. 13-20 illustrate a method of forming interlayer connectors with double etch stop layers for a second flow.

FIG. 13 illustrates a second etch mask formed over the landing areas 310 and 320. The second etch mask includes a second set of mask regions 1310, and a second set of spaced apart open etch regions 1320 for landing areas on alternating dielectric layers 140 and conductive layers 150. A first pair 315 of dielectric layers 140 and conductive layers 150 on top of the stack 130 (FIG. 1) are etched through to form landing areas 310 and 320 (FIG. 3).

Figure 14:
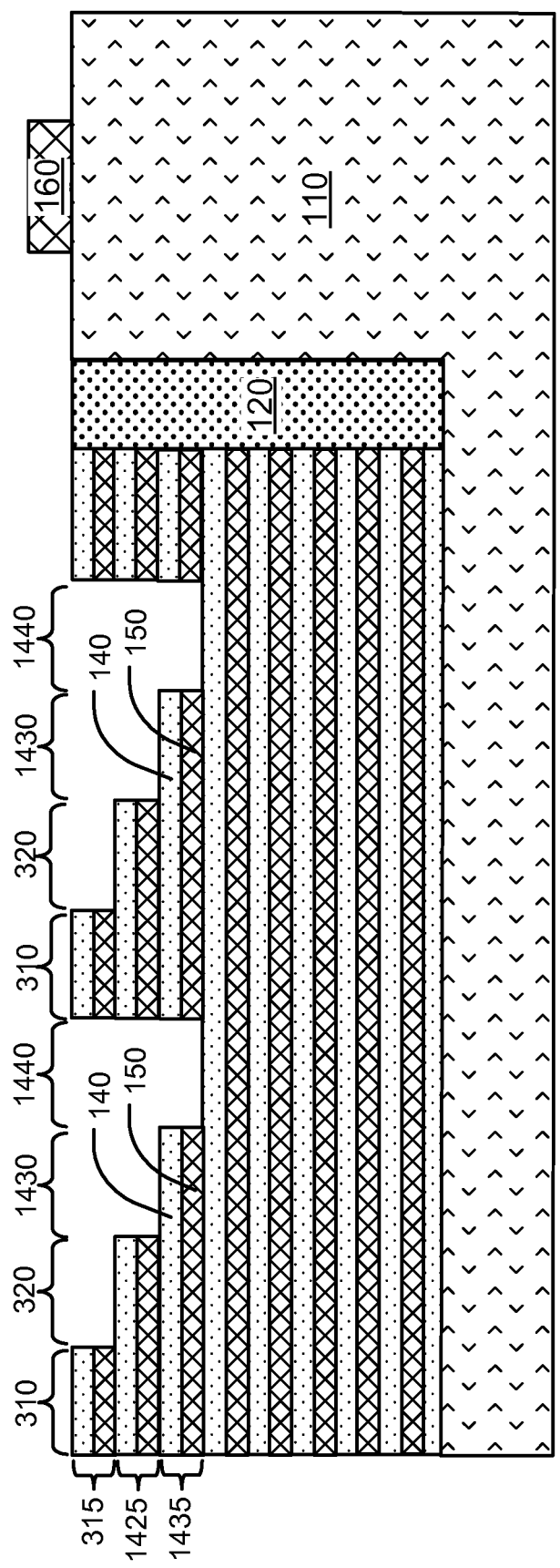

FIG. 14 illustrates the result of etching using the second etch mask on the alternating dielectric layers 140 and conductive layers 150. In reference to FIG. 14, the method removes portions of the alternating dielectric layers 140 and conductive layers 150 to form landing areas 1430 and 1440 on the plurality of conductive layers 150. The landing areas 1430 and 1440 are without overlying conductive layers in the stack 130. A second pair 1425 and a third pair 1435 of dielectric layers 140 and conductive layers 150 in the stack 130 are etched through to form landing areas 1430 and 1440, respectively, under the second set of open etch regions 1320. The second etch mask is removed after the landing areas 1430 and 1440 are formed.

Figure 15:
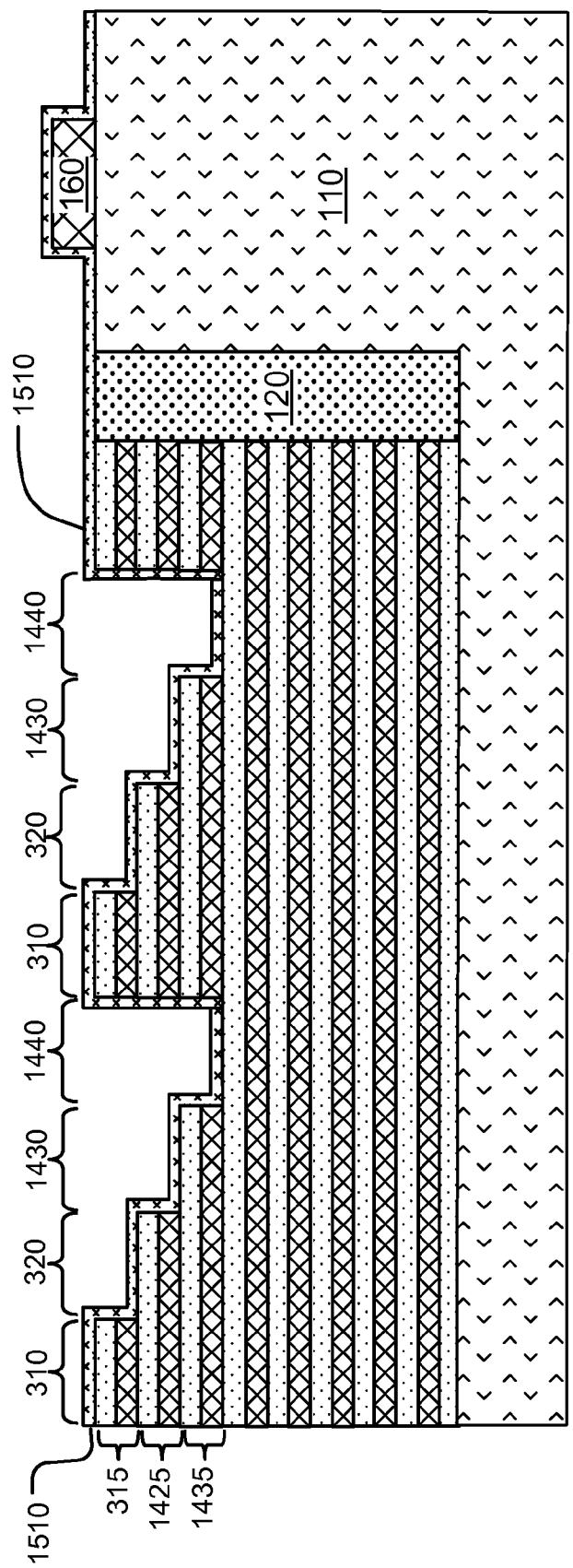

In reference to FIG. 15, the method forms a first incremental deposition of etch stop material 1510 over the landing areas 310, 320, 1430, and 1440. In the first flow, two incremental deposition of etch stop material are formed over the landing areas 310-320, and one incremental deposition of etch stop material is formed over the landing areas 630-640 (FIG. 7). For comparison, in the second flow, one incremental deposition of etch stop material is formed over the landing areas 310, 320, 1430, and 1440.

Figure 16:
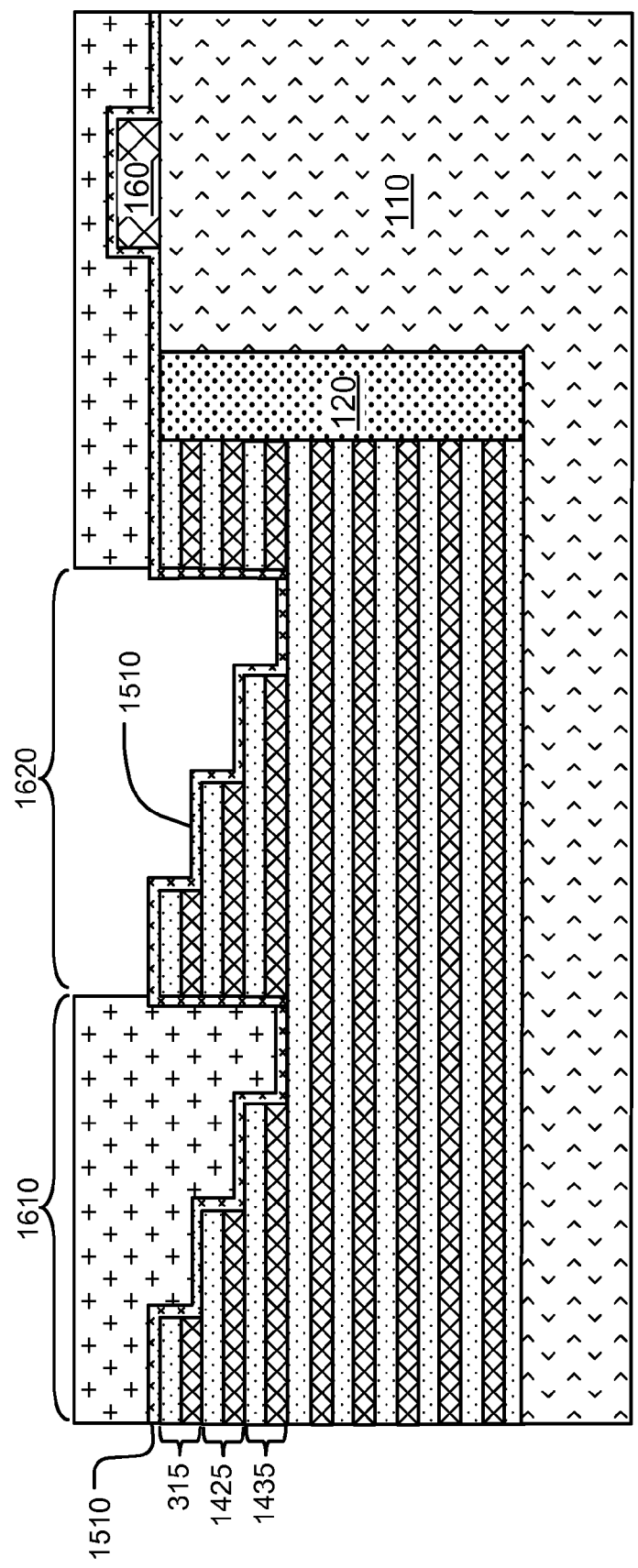

FIG. 16 illustrates a third etch mask formed over the first incremental deposition of etch stop material 1510. The third etch mask includes a third set of mask regions 1610, and a third set of spaced apart open etch regions 1620 for landing areas on alternating dielectric layers 140 and conductive layers 150.

Figure 17:
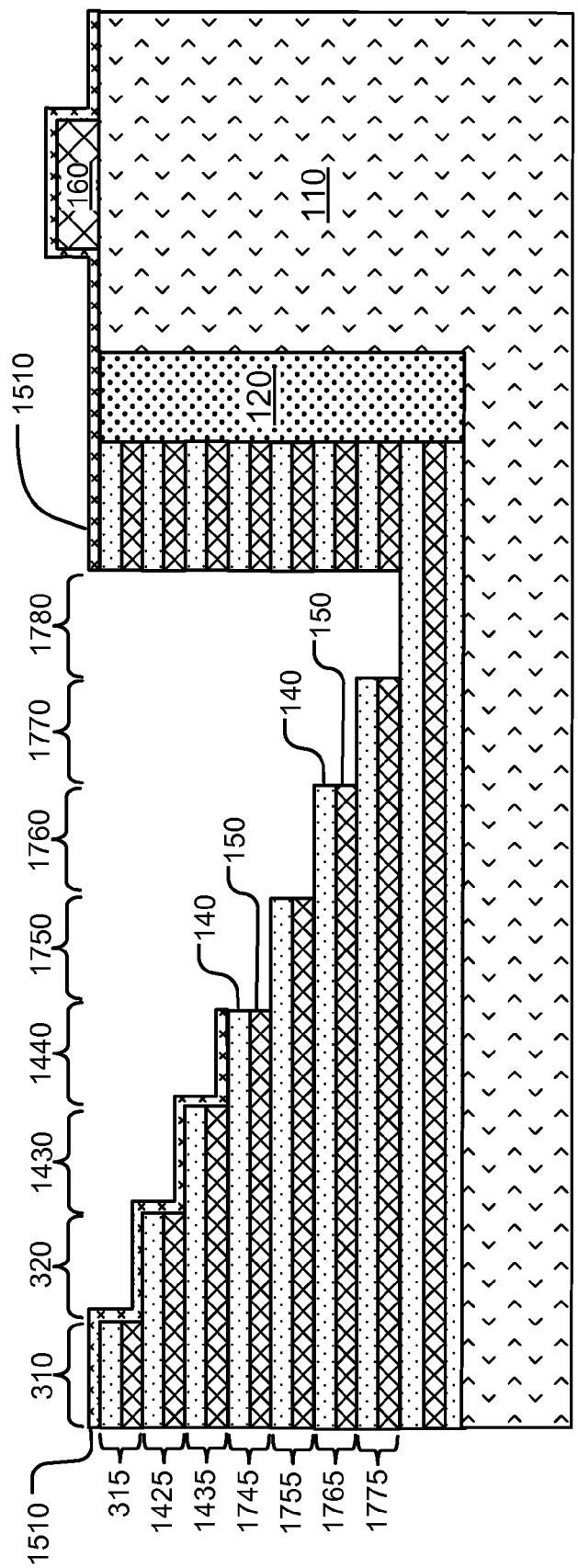

FIG. 17 illustrates the result of etching using the third etch mask on the alternating dielectric layers 140 and conductive layers 150. In reference to FIG. 17, the method removes portions of the first incremental deposition of etch stop material 1510, and portions of the alternating dielectric layers 140 and conductive layers 150 to form landing areas 1750, 1760, 1770, and 1780 on the plurality of conductive layers 150. The landing areas 1750, 1760, 1770, and 1780 are without overlying conductive layers in the stack 130. A fourth pair 1745, a fifth pair 1755, a sixth pair 1765, and a seventh pair 1775 of dielectric layers 140 and conductive layers 150 in the stack 130 are etched through to form landing areas 1750, 1760, 1770, and 1780, respectively, under the third set of open etch regions 1620. The third etch mask is removed after the landing areas 1750, 1760, 1770, and 1780 are formed.

Figure 18:
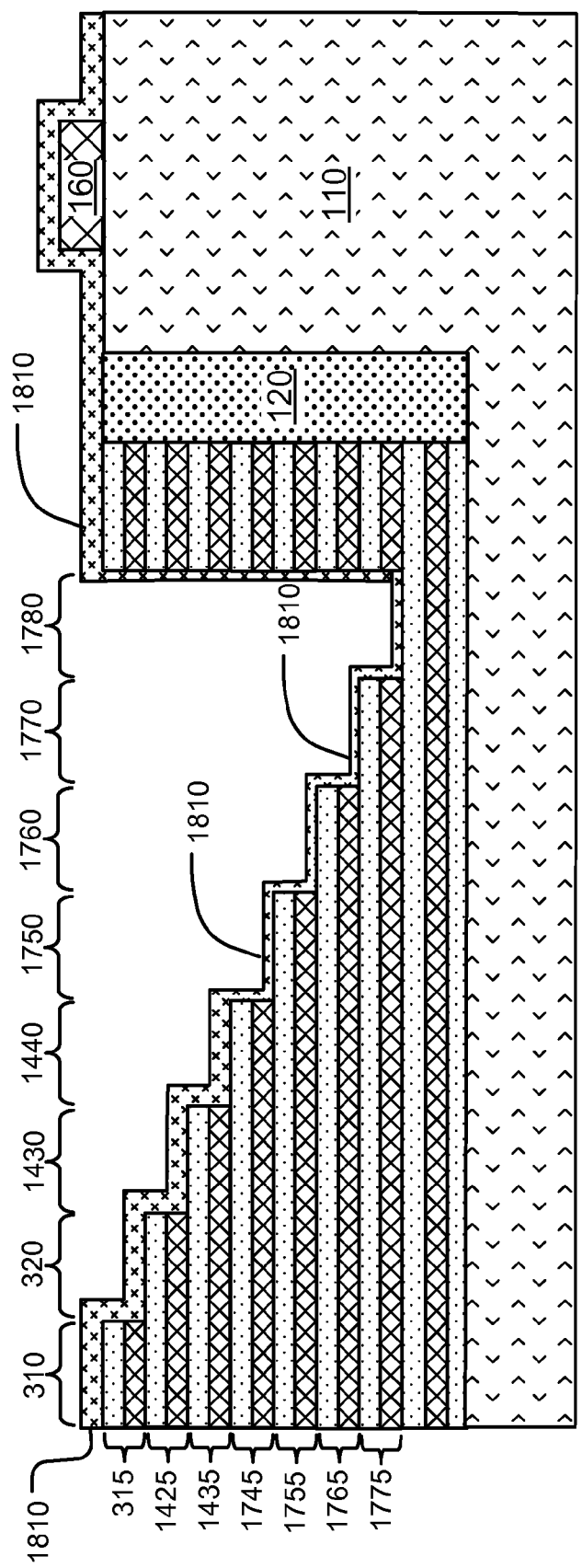

In reference to FIG. 18, the method forms a second incremental deposition of etch stop material 1810 over the landing areas 310, 320, 1430, 1440, and 1750-1780. Since the first incremental deposition of etch stop material 1510 is already formed over the landing areas 310, 320, 1430, and 1440, consequently two incremental depositions of etch stop material are formed over the landing areas 310-320, two incremental depositions of etch stop material are formed over the landing areas 1430-1440, and one incremental deposition of etch stop material is formed over the landing areas 1750-1780.

Figure 19:
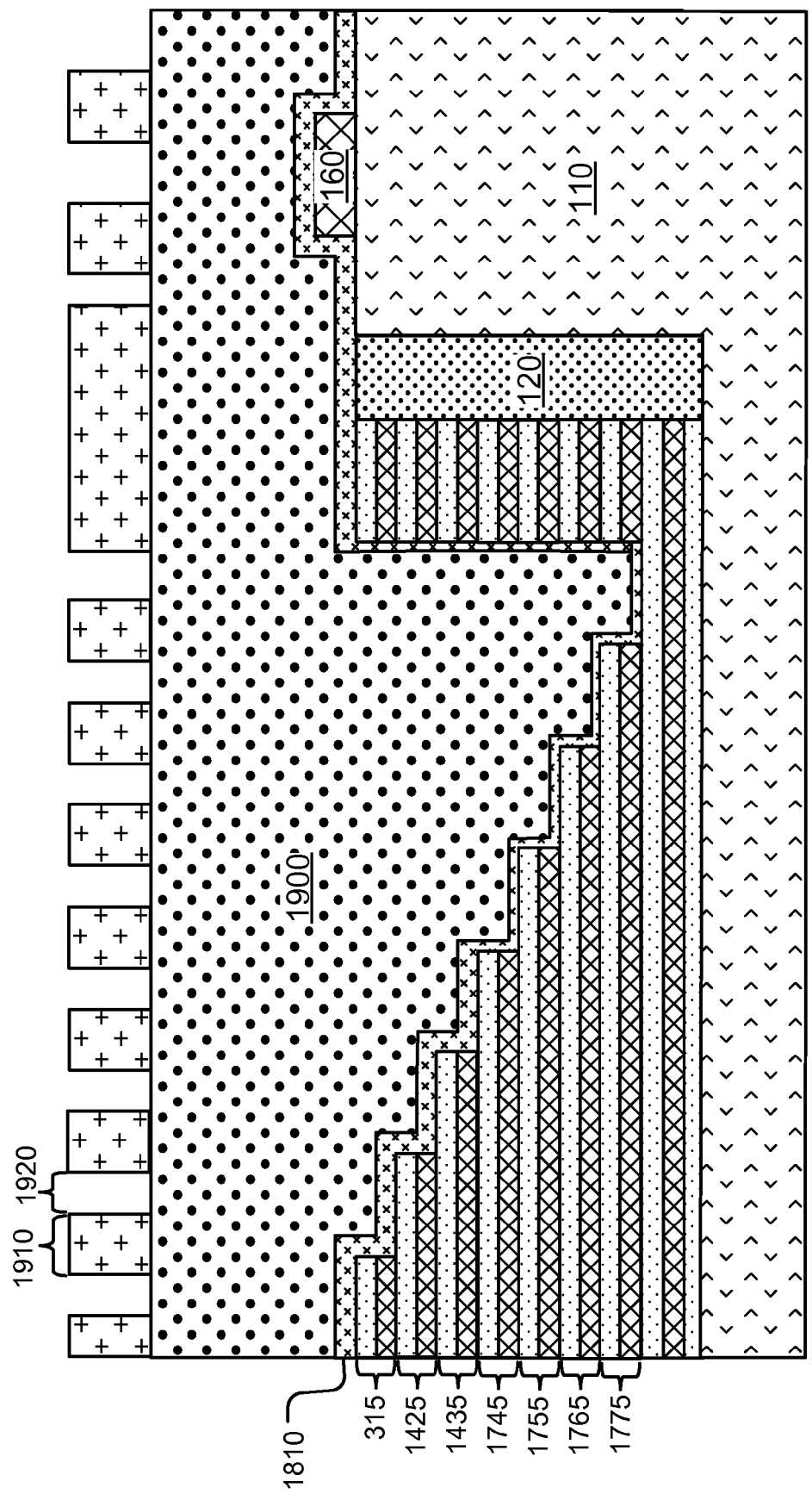

In reference to FIG. 19, the method fills over the landing areas 310-320, 1430-1440, and 1750-1780 with a dielectric fill material 1900, and forms a contact opening (CO) etch mask over the dielectric fill material 1900. The CO etch mask includes a set of mask regions 1910, and a set of spaced apart open etch regions 1920 for landing areas on alternating dielectric layers 140 and conductive layers 150.

Figure 20:
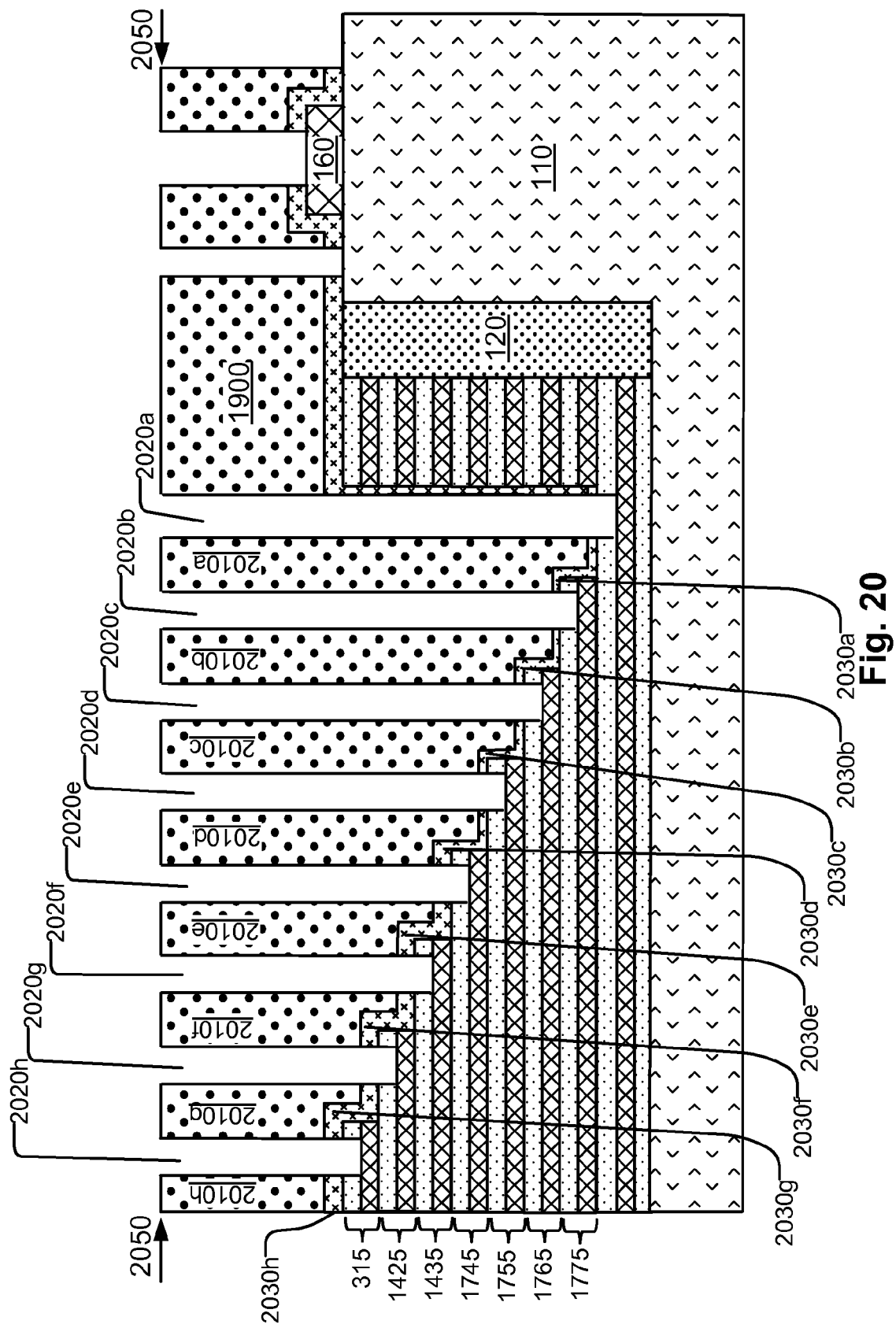

In reference to FIG. 20, the method uses a patterned etching process using the CO etch mask to form a plurality of vias 2020a-2020h extending through the dielectric fill material 1900 and the etch stop layers to the landing areas 310-320, 1430-1440, and 1750-1780 (FIGS. 3, 14, and 17) in the plurality of conductive layers 150. The patterned etching process includes first opening down to the etch stop layers, and second breaking through the etch stop layers to expose the landing areas.

Subsequently, the method forms interlayer connectors by filling the vias 2020a-2020h with conductive material up to the connector surface 2050. A planarization process may be applied to the plurality of filled vias to planarize the connector surface 2050. Thus the interlayer connectors are formed extending from the connector surface 2050 to respective ones of the plurality of conductive layers. The method may then form patterned conductor lines (not shown) on top of the connector surface and connected to respective interlayer connectors. The patterned conductor lines may be bit lines that connect to a plane decoder in three-dimensional stacked memory devices.

As described herein, to remove portions of the alternating dielectric and conductive layers to form landing areas on the plurality of conductive layers in the stack 130, the method uses a set of N etch masks with $2^{N-2}$ being less than W, and $2^N$ being greater than or equal to W, where the W is the number of conductive layers. For instance, in reference to FIGS. 1-3 and 13-20 for the second flow, N=3 and W=8. Thus the method uses a set of 3 etch masks with $2^N=8$ being equal to the W. The etch masks have mask regions and spaced apart open etch regions corresponding to selected landing areas, as shown in FIGS. 2, 13, and 16.

As described herein, for each etch mask n, where n goes from 1 to N, the method etches $2^{n-1}$ conductive layers over up to half of the landing areas, so that the landing areas on the plurality of conductive layers are exposed with different combinations of the etch masks. For instance, for etch mask n=1, the method etches 1 ($2^{1-1}=2^0=1$) conductive layer as shown in FIG. 3. For etch mask n=2, the method etches 2 ($2^{2-1}=2^1=2$)

conductive layers as shown in FIG. 14. For etch mask n=3, the method etches 4 ($2^{3-1}=2^2=4$) conductive layers as shown in FIG. 17. In each case, the method etches up to 4 or half of the 8 landing areas.

As described herein, after etching using at least two of the etch masks, the method forms a layer of etch stop material over the landing areas before etching using another of the etch masks. For instance, after etching using the first etch mask including mask regions 210 and open etch regions 220 as shown in FIG. 2, and the second etch mask including mask regions 1310 and open etch regions 1320 as shown in FIG. 13, the method forms a first incremental deposition of etch stop material 1510 over the landing areas before etching using another of the etch masks, such as the third etch mask including mask regions 1610 and open etch regions 1620 as shown in FIG. 16.

For a third flow, FIGS. 21-32 illustrate a method of forming interlayer connectors with layer by layer formation and multiple etch stop layers. The multiple etch stop layers include etch stop layers of multiple thicknesses. The first thickness results from an incremental deposition of etch stop material. The second thickness results from two incremental depositions of etch stop material, and thus is approximately equal to twice the first thickness. In general, for each additional etch stop layer, the thickness is increased by the first thickness. Thus one etch layer may be combined from multiple incremental depositions of etch stop material to result in multiple thicknesses. The interlayer connectors in the third flow extend from a connector surface to respective ones of the plurality of conductive layers. The third flow is based on the integrated circuit device 100 shown in FIG. 1. FIGS. 21-32 illustrate the third flow, continuing from FIG. 1.

Figure 21:
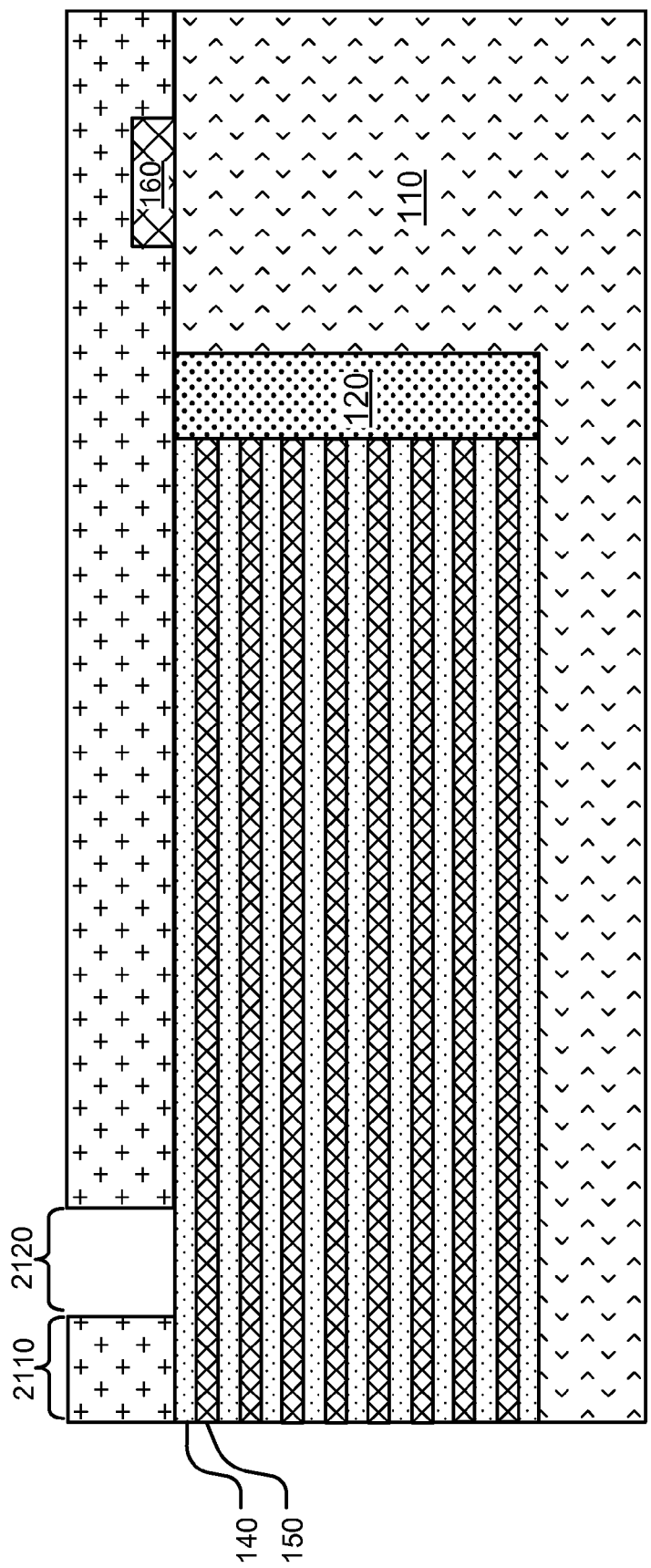
FIGS. 21-32 illustrate a method of forming interlayer connectors with layer by layer formation and multiple etch stop layers for a third flow.

FIG. 21 illustrates a first etch mask formed over the integrated circuit device 100 shown in FIG. 1. The first etch mask includes a first set of mask regions 2110, and a first set of spaced apart open etch regions 2120 corresponding to selected landing areas on alternating dielectric layers 140 and conductive layers 150. The selected landing areas will become evident from the discussion below.

Figure 22:
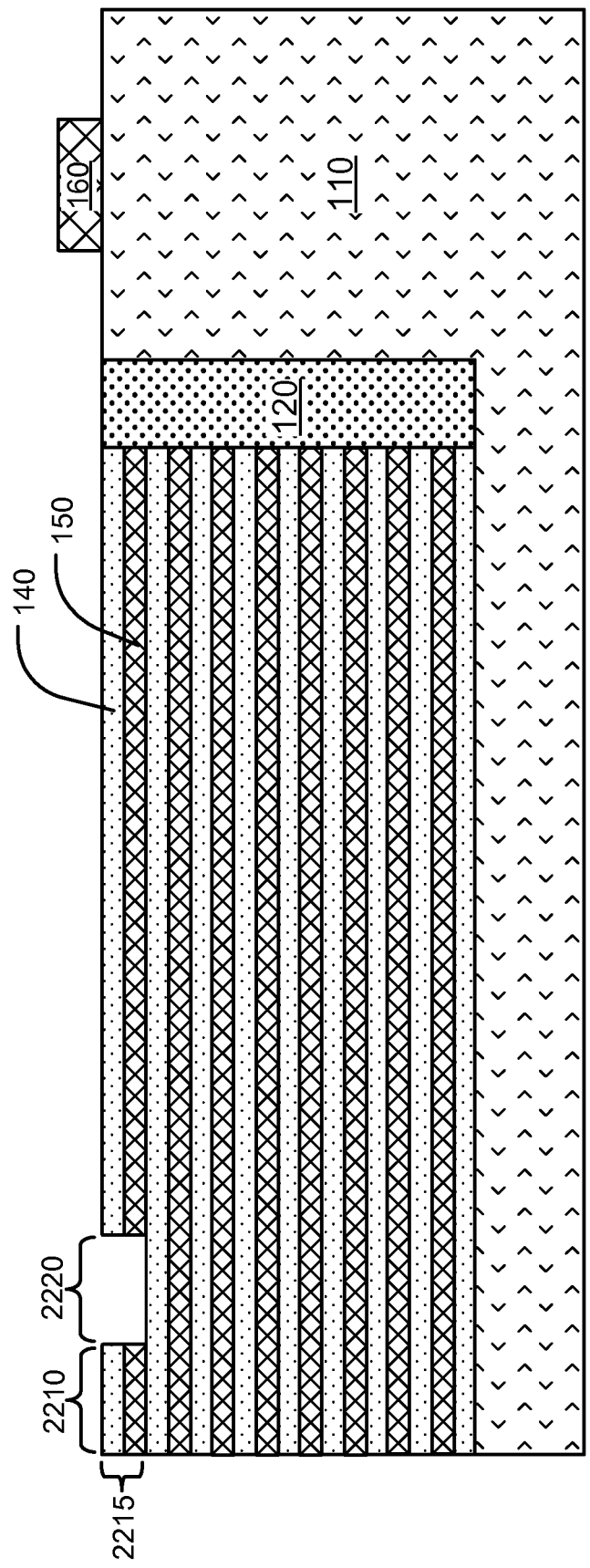

FIG. 22 illustrates the result of etching using the first etch mask on the alternating dielectric layers 140 and conductive layers 150. In reference to FIG. 22, the method removes portions of the alternating dielectric layers 140 and conductive layers 150 to form landing areas 2210 and 2220 on the plurality of conductive layers 150. The landing areas 2210 and 2220 are without overlying conductive layers in the stack 130. A first pair 2215 of dielectric layers 140 and conductive layers 150 on top of the stack 130 (FIG. 1) are etched through to form landing areas 2210 and 2220, under the first set of open etch regions 2120 (FIG. 21). The first etch mask is removed across the integrated circuit device 100 after the landing areas 2210 and 2220 are formed.

Figure 23:
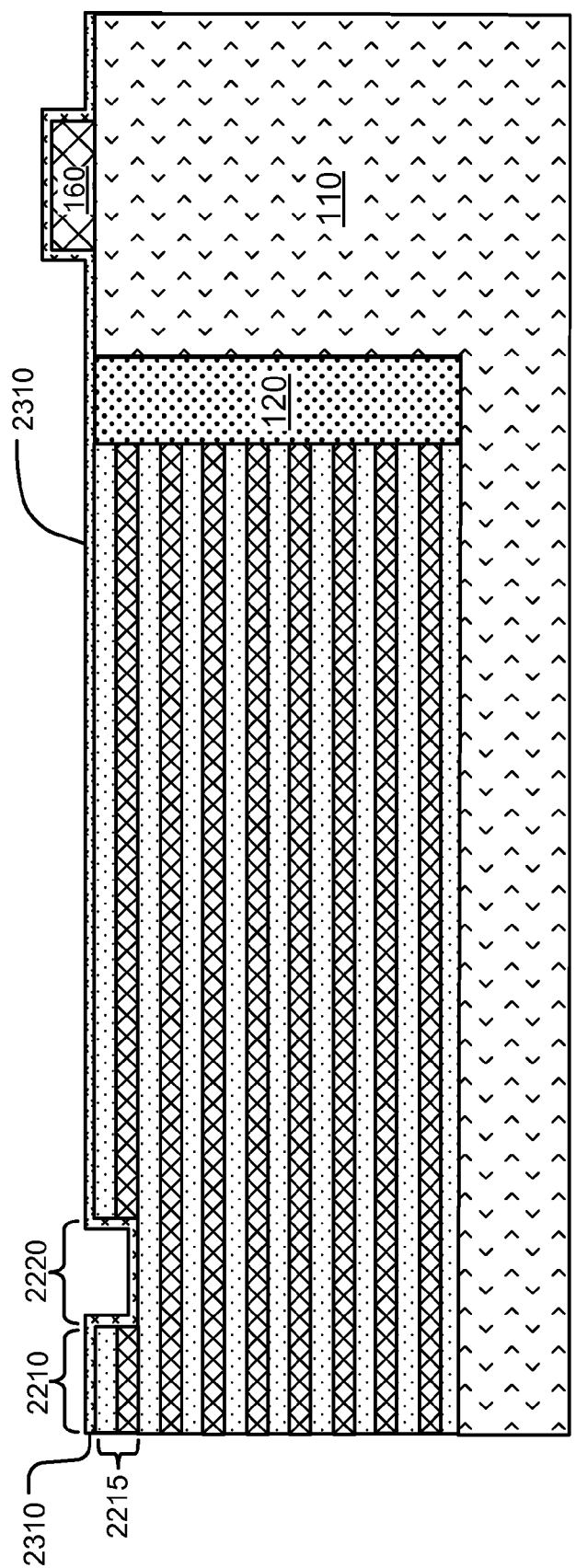

In reference to FIG. 23, the method forms a first incremental deposition of etch stop material 2310 over the landing areas 2210 and 2220. The method may form more incremental depositions of etch stop material as described later. The etch stop layers have thicknesses that correlate with depths of the corresponding landing areas.

Figure 24:
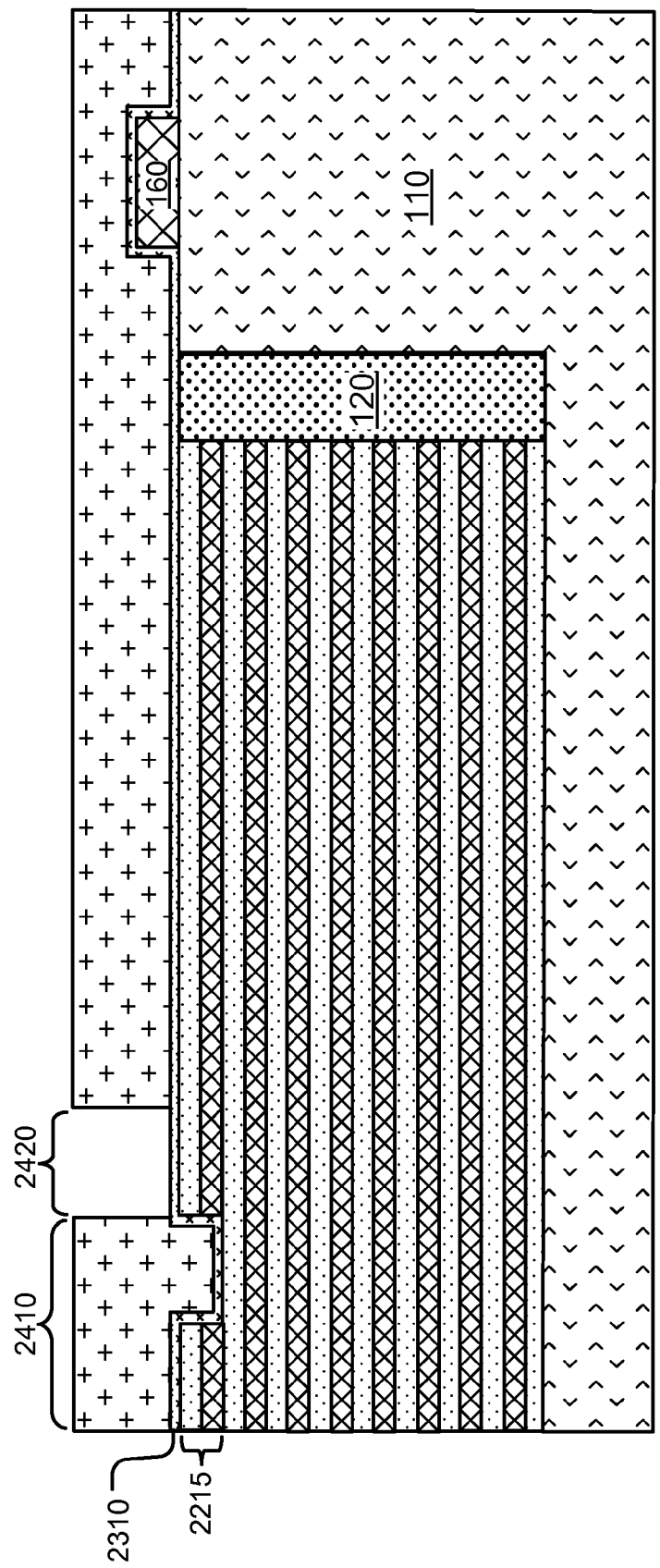

FIG. 24 illustrates a second etch mask formed over the first incremental deposition of etch stop material 2310. The second etch mask includes a second set of mask regions 2410, and a second set of spaced apart open etch regions 2420 for landing areas on alternating dielectric layers 140 and conductive layers 150.

Figure 25:
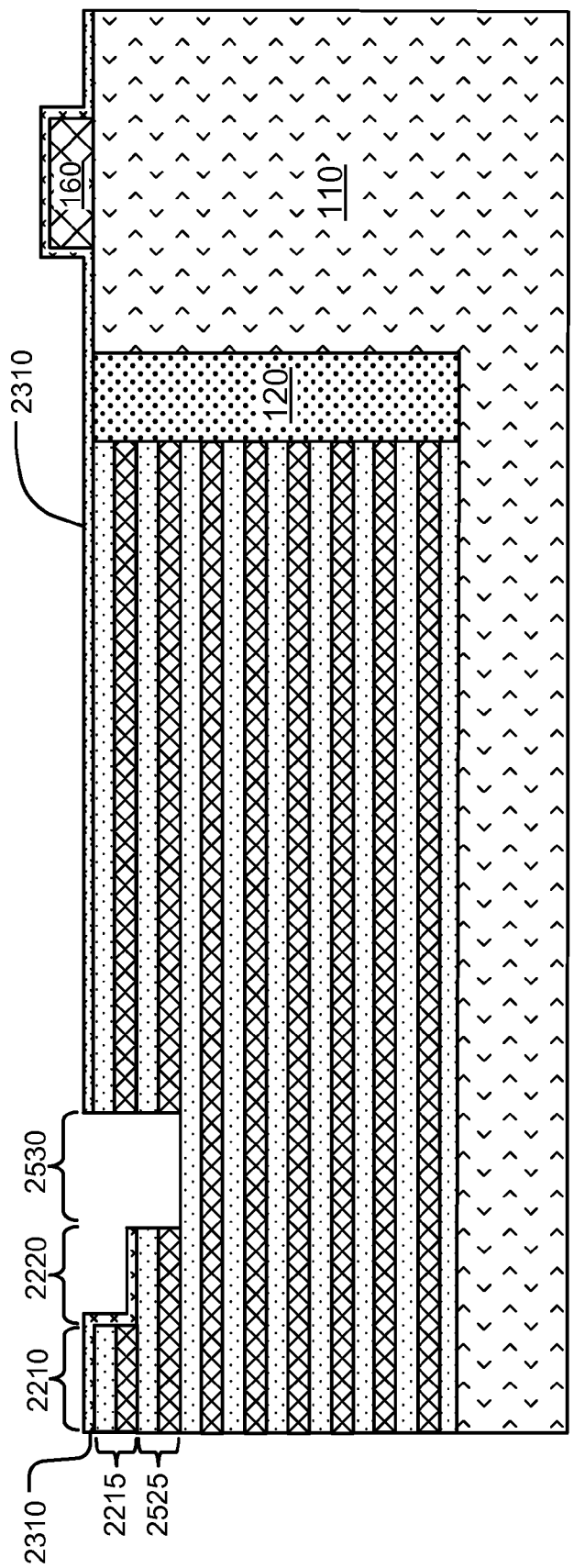

FIG. 25 illustrates the result of etching using the second etch mask on the alternating dielectric layers 140 and conductive layers 150. In reference to FIG. 25, the method removes portions of the first incremental deposition of etch stop material 2310, and portions of the alternating dielectric layers 140 and conductive layers 150 to form landing areas 2530 on the plurality of conductive layers 150. The landing areas 2530 are without overlying conductive layers in the stack 130. A second pair 2525 of dielectric layers 140 and conductive layers 150 in the stack 130 are etched through to form the landing areas 2530, under the second set of open etch regions 2420. The second etch mask is removed after the landing areas 2530 are formed.

Figure 26:
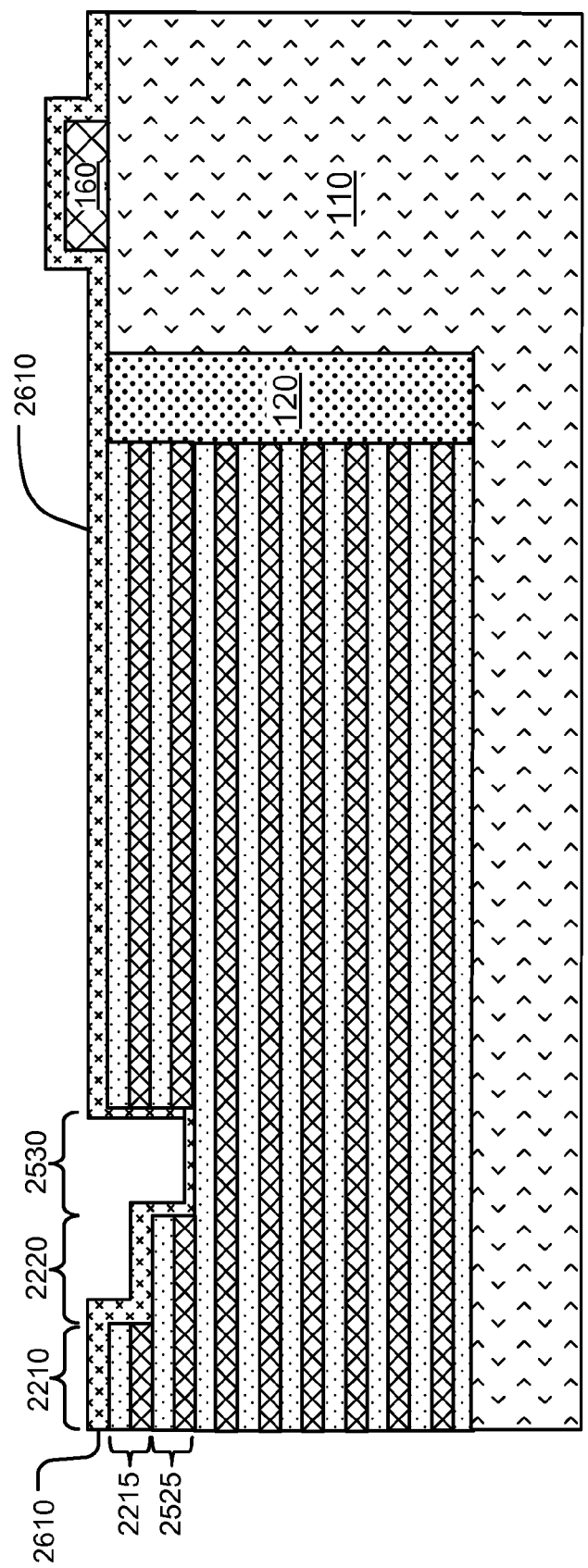

In reference to FIG. 26, the method forms a second incremental deposition of etch stop material 2610 over the landing areas 2210, 2220, and 2530. Since the first incremental deposition of etch stop material 2310 is already formed over the landing areas 2210 and 2220, consequently two incremental depositions of etch stop material are formed over the landing areas 2210 and 2220, and one incremental deposition of etch stop material is formed over the landing areas 2530.

Figure 27:
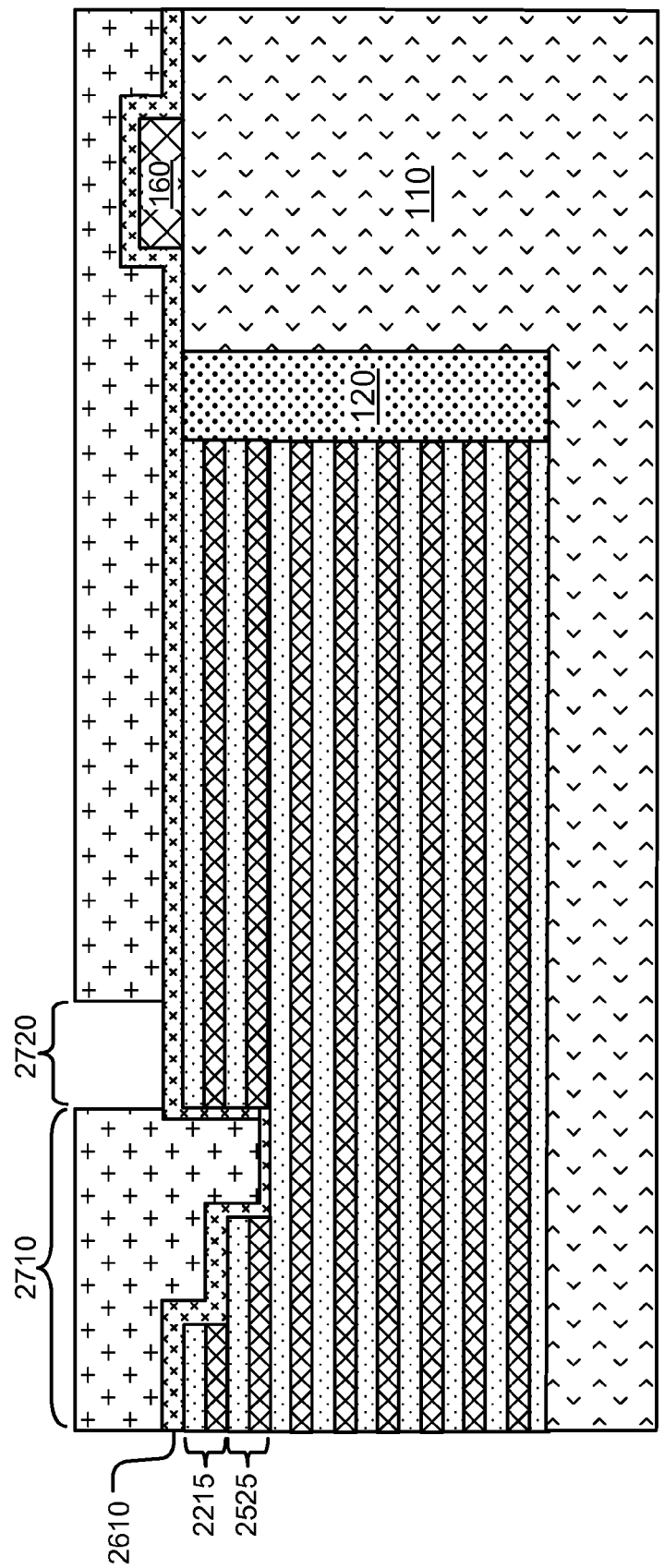

FIG. 27 illustrates a third etch mask formed over the second incremental deposition of etch stop material 2610. The third etch mask includes a third set of mask regions 2710, and a third set of spaced apart open etch regions 2720 for landing areas on alternating dielectric layers 140 and conductive layers 150.

Figure 28:
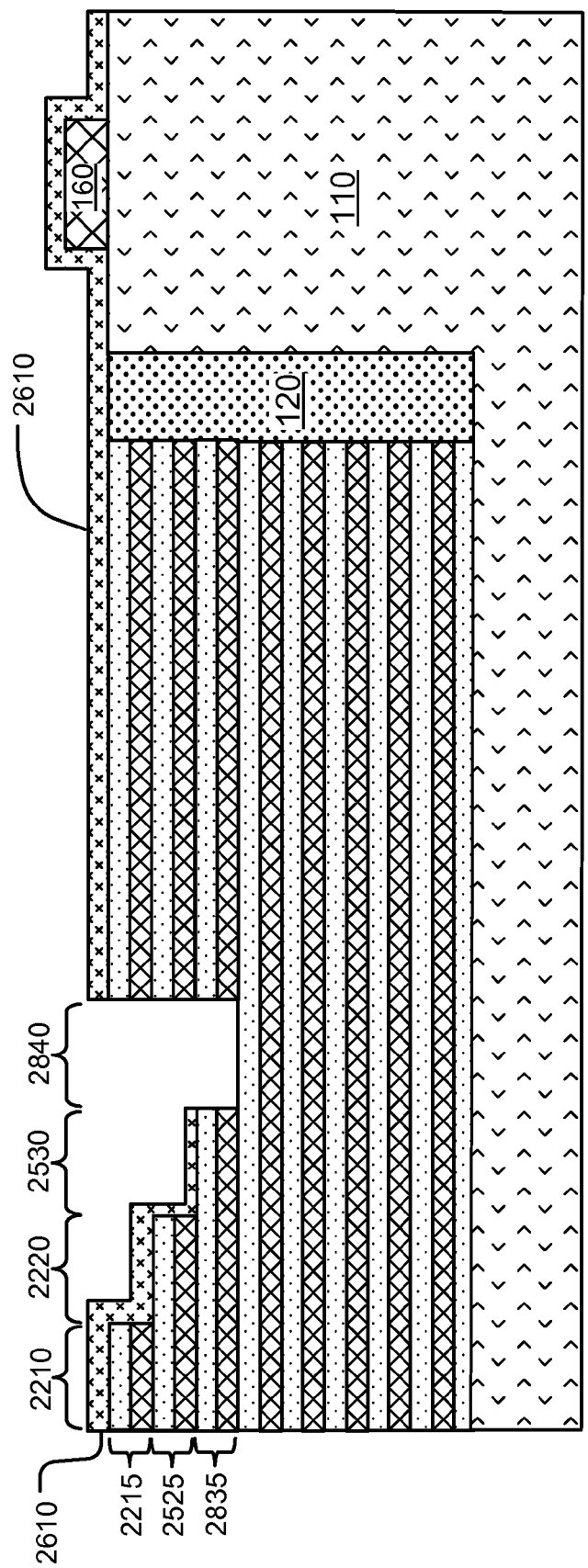

FIG. 28 illustrates the result of etching using the third etch mask on the alternating dielectric layers 140 and conductive layers 150. In reference to FIG. 28, the method removes portions of the first incremental deposition of etch stop material 2310, portions of the second incremental deposition of etch stop material 2610, and portions of the alternating dielectric layers 140 and conductive layers 150 to form landing areas 2840 on the plurality of conductive layers 150. The landing areas 2840 are without overlying conductive layers in the stack 130. A third pair 2835 of dielectric layers 140 and conductive layers 150 in the stack 130 are etched through to form landing areas 2840, under the third set of open etch regions 2720. The third etch mask is removed after the landing areas 2840 are formed.

Figure 29:
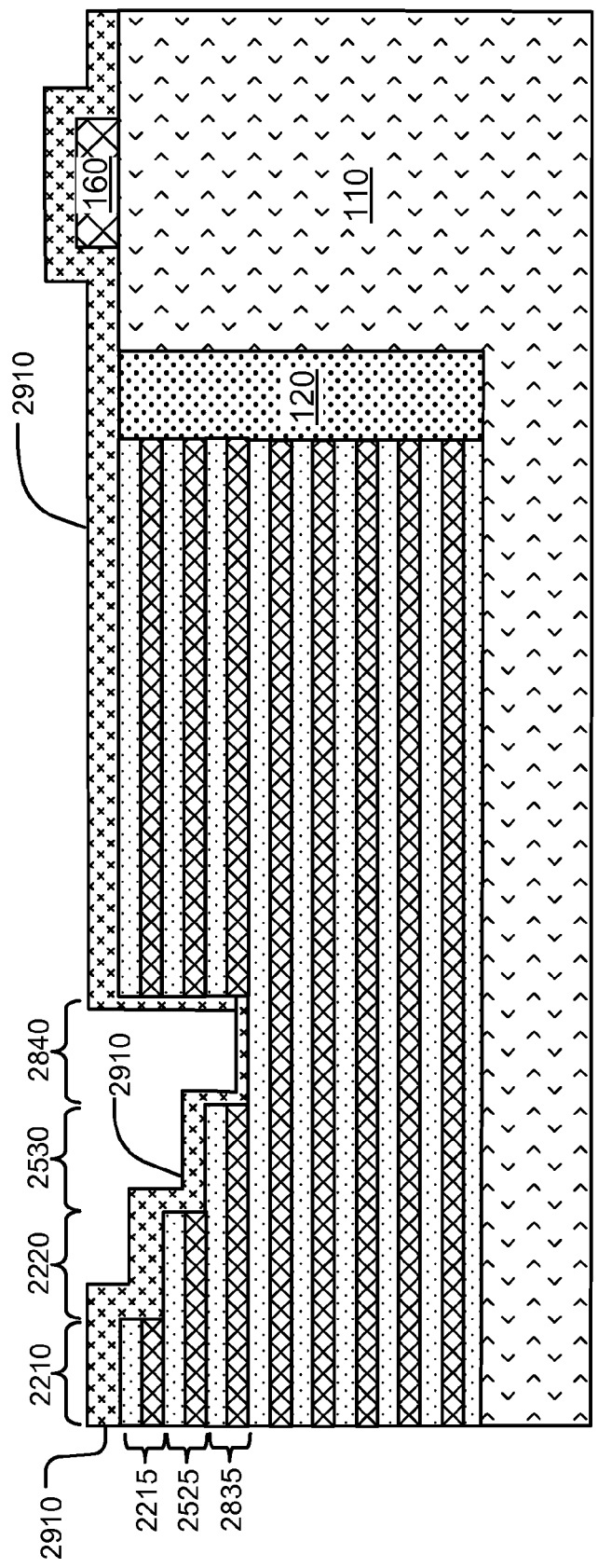

In reference to FIG. 29, the method forms a third incremental deposition of etch stop material 2910 over the landing areas 2210, 2220, 2530, and 2840. Since the first incremental deposition of etch stop material 2310 is already formed over the landing areas 2210 and 2220, and the second incremental deposition of etch stop material 2610 is already formed over the landing areas 2210, 2220, and 2530, consequently three incremental depositions of etch stop material are formed over the landing areas 2210 and 2220, two incremental depositions of etch stop material are formed over the landing areas 2210, 2220, and 2530, and one incremental deposition of etch stop material is formed over the landing areas 2210, 2220, 2530, and 2840.

Figure 30:
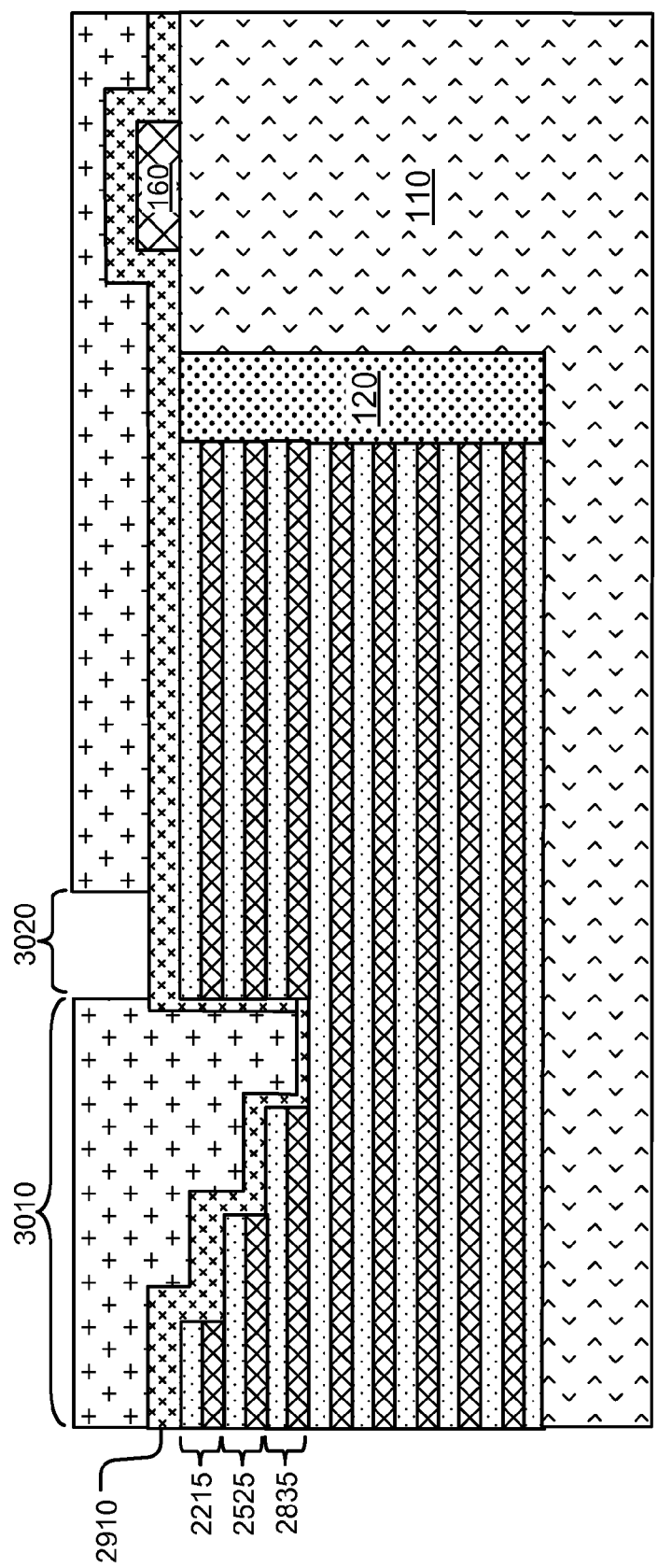

FIG. 30 illustrates a fourth etch mask formed over the third incremental deposition of etch stop material 2910. The third etch mask includes a third set of mask regions 3010, and a third set of spaced apart open etch regions 3020 for landing areas on alternating dielectric layers 140 and conductive layers 150.

Figure 31:
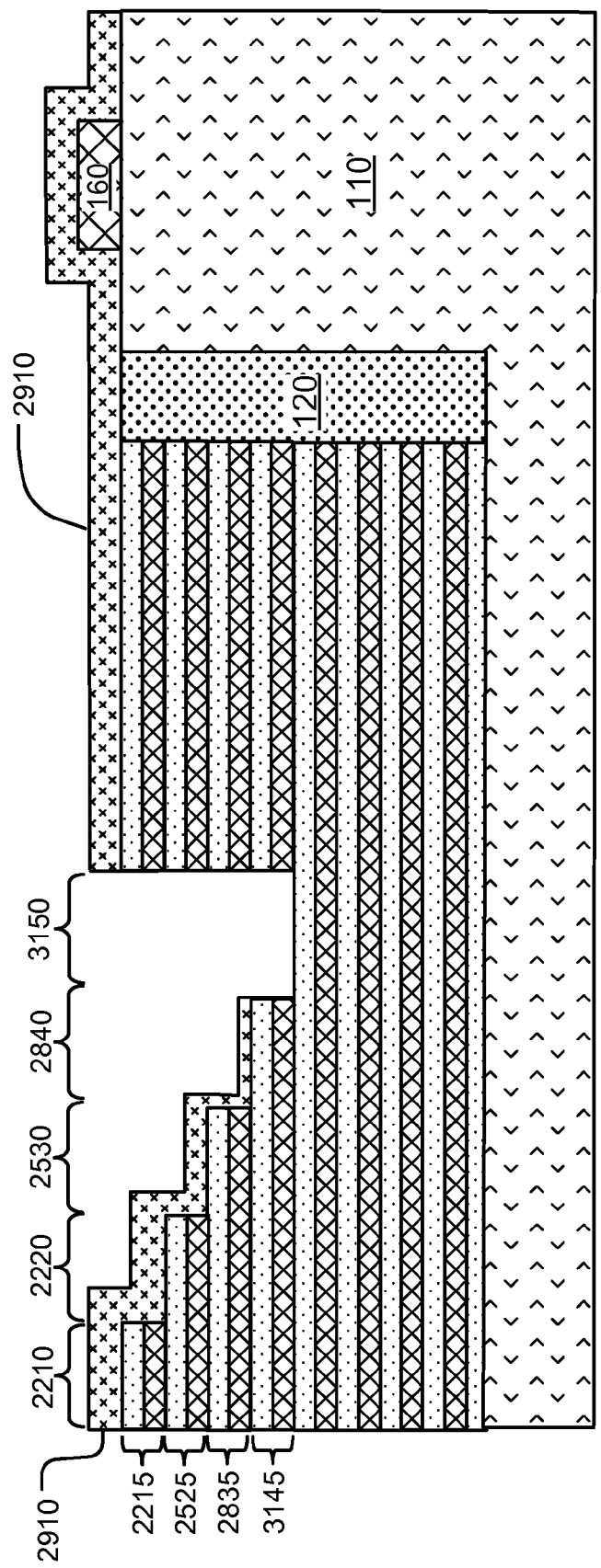

FIG. 31 illustrates the result of etching using the fourth etch mask on the alternating dielectric layers 140 and conductive layers 150. In reference to FIG. 31, the method removes portions of the first incremental deposition of etch stop material 2310, portions of the second incremental deposition of etch stop material 2610, portions of the third incremental deposition of etch stop material 2910, and portions of the alternating dielectric layers 140 and conductive layers 150 to form landing areas 3150 on the plurality of conductive layers 150. The landing areas 3150 are without overlying conductive layers in the stack 130. A fourth pair 3145 of dielectric layers 140 and conductive layers 150 in the stack 130 are etched through to form landing areas 3150, under the third set of open etch regions 3020. The third etch mask is removed after the landing areas 3150 are formed.

Figure 32:
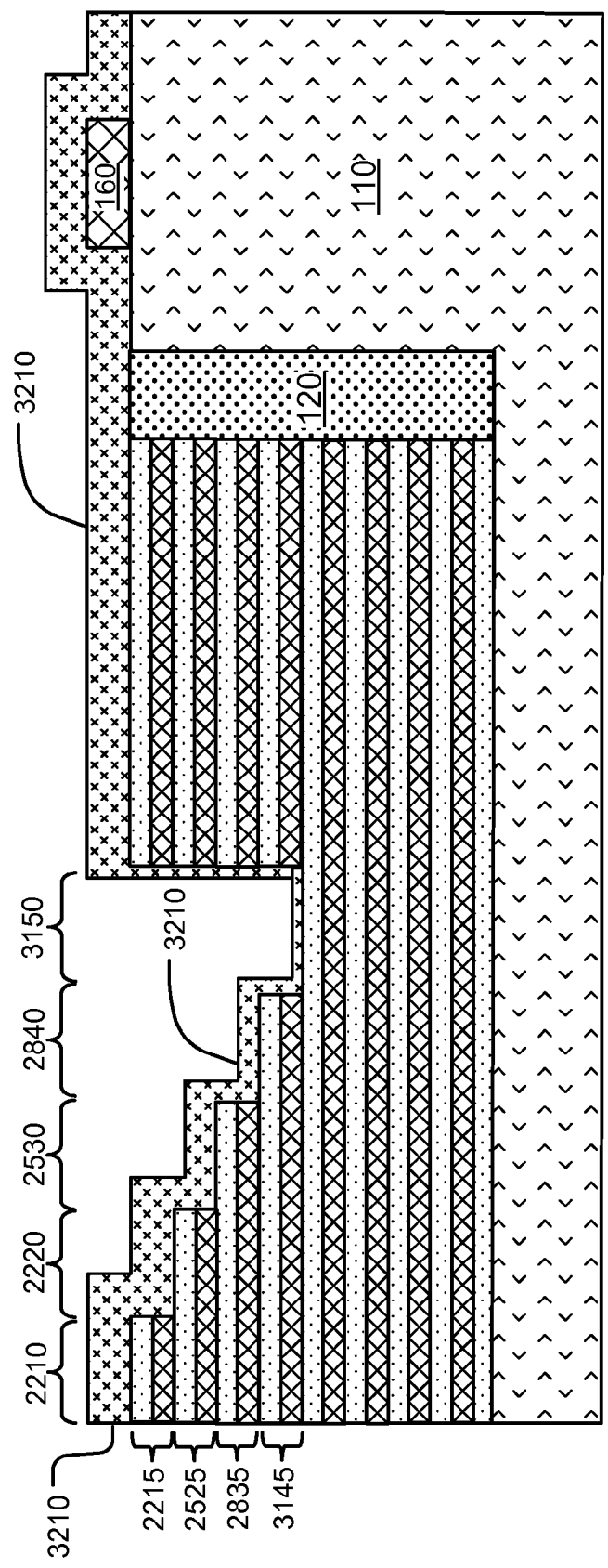

In reference to FIG. 32, the method forms a fourth incremental deposition of etch stop material 3210 over the landing areas 2210, 2220, 2530, 2840, and 3150. Since the first incremental deposition of etch stop material 2310 is already formed over the landing areas 2210 and 2220, the second incremental deposition of etch stop material 2610 is already formed over the landing areas 2210, 2220, and 2530, and the third incremental deposition of etch stop material 2910 is already formed over the landing areas 2210, 2220, 2530, and 2840, consequently four incremental depositions of etch stop material are formed over the landing areas 2210 and 2220, three incremental depositions of etch stop material are formed over the landing areas 2530, two incremental depositions of etch material are formed over the landing areas 2840, and one incremental deposition of etch stop material is formed over the landing areas 3150.

As examples, FIGS. 21-23, FIGS. 24-26, FIGS. 27-29, and FIGS. 30-32 illustrate the method to remove portions of the alternating dielectric and conductive layers to form landing areas with respective etch masks, and to form the first, second, third, and fourth etch stop layers with increasing thicknesses. More etch stop layers may be formed using the layer by layer formation method described herein. For instance, to form interlayer connectors for eight alternating dielectric and conductive layers in the stack 130 as shown in FIG. 1, seven etch stop layers may be formed with increasing thicknesses of 1, 2, 3, 4, 5, 6, 7, and 7 for each landing area, where the number for thicknesses denotes the number of incremental depositions of etch stop materials on a particular landing area.

After the etch stop layers are formed, the method fills over the landing areas with a dielectric fill material, and forms a contact opening (CO) etch mask including a set of mask regions and a set of spaced apart open etch regions for landing areas on alternating dielectric layers and conductive layers.

The method then uses a patterned etching process using the CO etch mask to form a plurality of vias, such as the vias 2020a-2020h illustrated in FIG. 20, extending through the dielectric fill material and the etch stop layers to the landing areas, such as the landing areas 2210, 2220, 2530, 2840, and 3150 (FIG. 32) in the plurality of conductive layers, such as conductive layers 150. The patterned etching process includes first opening down to the etch stop layers, and second breaking through the etch stop layers to expose the landing areas.

Subsequently, the method forms interlayer connectors by filling the vias with conductive material up to a connector surface, similar to the connector surface 2050 in FIG. 20. A planarization process may be applied to the plurality of filled vias to planarize the connector surface. Thus the interlayer connectors are formed extending from the connector surface to respective ones of the plurality of conductive layers. The method may then form patterned conductor lines (not shown) on top of the connector surface and connected to respective interlayer connectors. The patterned conductor lines may be bit lines that connect to a plane decoder in three-dimensional stacked memory devices.

As described herein, the method removes portions of the alternating dielectric and conductive layers using a set of N etch masks. After etching using each of the N etch masks, the method forms a layer of etch stop material over the landing areas before etching using another of the etch masks. For instance, after etching using the first etch mask including mask regions 2110 and open etch regions 2120 as shown in FIG. 21, the method forms a first incremental deposition of etch stop material 2310 over the landing areas before etching using another of the etch masks, such as the second etch mask including mask regions 2410 and open etch regions 2420 as shown in FIG. 24. For another instance, after etching using the second etch mask including mask regions 2410 and open etch regions 2420 as shown in FIG. 24, the method forms a second incremental deposition of etch stop material 2610 over the landing areas before etching using another of the etch masks, such as the third etch mask including mask regions 2710 and open etch regions 2720 as shown in FIG. 27.

An integrated circuit comprising a plurality of interlayer connectors is made as set forth in the method described herein. The plurality of conductive layers in the integrated circuit are connected to corresponding planes of a 3D memory array.

The present application provides a multi-level vertical plug formation with stop layers of increasing thicknesses. The formation includes a stack including a plurality of conductive layers interleaved with a plurality of dielectric layers, and landing areas on the plurality of conductive layers in the stack. The landing areas are without overlying conductive layers in the stack. The formation includes etch stop layers over corresponding landing areas. The etch stop layers have thicknesses that correlate with depths of the corresponding landing areas. The formation includes a plurality of vias extending through the dielectric fill material and the etch stop layers to the landing areas in the plurality of conductive layers.

The formation includes interlayer connectors connected to respective conductive layers in the stack through the plurality of vias, dielectric formations in a plurality of dielectric formations interleaved with the interlayer connectors, and patterned conductor lines on top of the connector surface and connected to respective interlayer connectors. The patterned conductor lines may be bit lines that connect to a plane decoder in three-dimensional stacked memory devices. The interlayer connectors have depths increasing from the greatest depth at the first interlayer connector to the shallowest depth at the last interlayer connector. The dielectric formations have depths increasing from the greatest depth at the first dielectric formation to the shallowest depth at the last dielectric formation. The dielectric formations are separated from dielectric layers in the plurality of dielectric layers by a plurality of etch stop layers having thicknesses that correlate with the depths of the interlayer connectors.

For the first flow, the plurality of etch stop layers includes N etch stop layers corresponding to N interlayer connectors. As an example illustrated by FIG. 12, N equals 8. Accordingly there are 8 interlayer connectors formed in vias 1220a-1220h interleaved with 8 dielectric formations 1210a-1210h. The dielectric formations 1210a-1210h are separated from the respective dielectric layers by 8 etch stop layers 1230a-1230h, respectively. For each etch stop layer n, where n goes from 1 to m1, the etch stop layer n has a first thickness approximately equal to the thickness of etch stop layer 1. For each etch stop layer n, where n goes from (m1+1) to m2, the etch stop layer n has a second thickness approximately equal to twice the thickness of etch stop layer 1. For each etch stop layer n, where n goes from (m2+1) to N, the etch stop layer n has a third thickness approximately equal to three times the thickness of etch stop layer 1. For this flow, m1 is greater than 1 and less than m2, and m2 is greater than m1 and less than N.

In FIG. 12, m1 equals 4, m2 equals 6, and N equals 8. Accordingly, etch stop layers 1230a-1230d have a first thickness approximately equal to the thickness of etch stop layer 1.

Etch stop layers 1230e-1230f have a second thickness approximately equal to twice the thickness of etch stop layer 1. Etch stop layers 1230g-1230h have a third thickness approximately equal to three times the thickness of etch stop layer 1.

For the second flow, the plurality of etch stop layers includes N etch stop layers corresponding to N interlayer connectors. As an example illustrated by FIG. 20, N equals 8. Accordingly there are 8 interlayer connectors formed in vias 2020a-2020h interleaved with 8 dielectric formations 2010a-2010h. The dielectric formations 2010a-2010h are separated from the respective dielectric layers by 8 etch stop layers 2030a-2030h, respectively. For each etch stop layer n, where n goes from 1 to m, the etch stop layer n has a first thickness approximately equal to the thickness of etch stop layer 1. For each etch stop layer n, where n goes from (m+1) to N, the etch stop layer n has a second thickness approximately equal to twice the thickness of etch stop layer 1. For this flow, m is greater than 1 and less than N.

In FIG. 20, m equals 4, and N equals 8. Accordingly, etch stop layers 1-4 have a first thickness approximately equal to the thickness of etch stop layer 1. Etch stop layers 5-8 have a second thickness approximately equal to twice the thickness of etch stop layer 1.

For the third flow, the plurality of etch stop layers includes N etch stop layers corresponding to N interlayer connectors. For instance, if N equals 8, then there are 8 interlayer connectors interleaved with 8 dielectric formations. The dielectric formations are separated from the respective dielectric layers by 8 etch stop layers, respectively. For each etch stop layer n, where n goes from 1 to (N−1), the etch stop layer n has a thickness approximately equal to n times the thickness of etch stop layer 1. Etch stop layer N has a thickness approximately equal to (N−1) times the thickness of etch stop layer 1.

If N equals 8, etch stop layers 1-8 have thicknesses approximately equal to 1, 2, 3, 4, 5, 6, 7, and 7 times the thickness of etch stop layer 1, respectively.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit including a multi-level vertical plug formation with stop layers of increasing thicknesses, comprising:
   a substrate within which a pit is formed;
   a stack including a plurality of conductive layers interleaved with a plurality of dielectric layers within the pit such that an uppermost one of the conductive layers is below a top surface of the substrate;
   landing areas on the plurality of conductive layers in the stack, the landing areas without overlying conductive layers in the stack;
   etch stop layers over corresponding landing areas, the etch stop layers having thicknesses that correlate with depths of the corresponding landing areas;
   a plurality of vias extending through the etch stop layers to the landing areas in the plurality of conductive layers;
   interlayer connectors connected to respective conductive layers in the stack through the plurality of vias; and
   an isolation region extending into the substrate separating the stack from an array periphery region.

2. The integrated circuit of claim 1, wherein the interlayer connectors have depths increasing from the greatest depth at the first interlayer connector to the shallowest depth at the last interlayer connector.

3. The integrated circuit of claim 1, further comprising patterned conductor lines on top of the connector surface and connected to respective interlayer connectors.

4. The integrated circuit of claim 1, further comprising dielectric formations in a plurality of dielectric formations interleaved with the interlayer connectors.

5. The integrated circuit of claim 4, wherein the dielectric formations have depths increasing from the greatest depth at the first dielectric formation to the shallowest depth at the last dielectric formation.

6. The integrated circuit of claim 4, wherein the dielectric formations are separated from dielectric layers in the plurality of dielectric layers by the etch stop layers.

7. The integrated circuit of claim 1, wherein:
   the plurality of etch stop layers includes N etch stop layers corresponding to N interlayer connectors;
   for each etch stop layer n, where n goes from 1 to m1, the etch stop layer n has a first thickness approximately equal to the thickness of etch stop layer 1;
   for each etch stop layer n, where n goes from (m1+1) to m2, the etch stop layer n has a second thickness approximately equal to twice the thickness of etch stop layer 1; and
   for each etch stop layer n, where n goes from (m2+1) to N, the etch stop layer n has a third thickness approximately equal to three times the thickness of etch stop layer 1;
   wherein m1 is greater than 1 and less than m2, and m2 is greater than m1 and less than N.

8. The integrated circuit of claim 1, wherein:
   the plurality of etch stop layers includes N etch stop layers corresponding to N interlayer connectors;
   for each etch stop layer n, where n goes from 1 to m, the etch stop layer n has a first thickness approximately equal to the thickness of etch stop layer 1; and
   for each etch stop layer n, where n goes from (m+1) to N, the etch stop layer n has a second thickness approximately equal to twice the thickness of etch stop layer 1;
   wherein m is greater than 1 and less than N.

9. The integrated circuit of claim 1, wherein:
   the plurality of etch stop layers includes N etch stop layers corresponding to N interlayer connectors;
   for each etch stop layer n, where n goes from 1 to (N−1), the etch stop layer n has a thickness approximately equal to n times the thickness of etch stop layer 1; and
   etch stop layer N has a thickness approximately equal to (N−1) times the thickness of etch stop layer 1.

* * * * *